United States Patent [19]
Kohno et al.

[11] Patent Number: 5,635,756
[45] Date of Patent: Jun. 3, 1997

[54] SEMICONDUCTOR DEVICE, LEAD FRAME THEREFOR AND MEMORY CARD TO PROVIDE A THIN STRUCTURE

[75] Inventors: Ryuji Kohno, Ibaraki-ken; Makoto Kitano, Tsuchiura; Asao Nishimura, Ushiku, all of Japan

[73] Assignee: Hitachi, Ltd., Tokyo, Japan

[21] Appl. No.: 369,486

[22] Filed: Jan. 6, 1995

Related U.S. Application Data

[62] Division of Ser. No. 75,928, Jun. 14, 1993, Pat. No. 5,391,916, which is a continuation of Ser. No. 680,522, Apr. 4, 1991, abandoned.

[30] Foreign Application Priority Data

Apr. 6, 1990 [JP] Japan ................ 2-090332

[51] Int. Cl.⁶ ................ H01L 23/495
[52] U.S. Cl. ............ 257/676; 257/666; 257/679; 257/723; 257/787
[58] Field of Search ........... 257/679, 676, 257/666, 678, 787, 723

[56] References Cited

U.S. PATENT DOCUMENTS

| | | |
|---|---|---|
| 3,708,730 | 1/1973 | Schierz et al. . |
| 4,137,546 | 1/1979 | Frusco . |
| 4,635,092 | 1/1987 | Yerman et al. . |
| 4,680,613 | 7/1987 | Daniels et al. . |
| 4,766,478 | 8/1988 | Dennis . |
| 4,816,427 | 3/1989 | Dennis . |
| 4,843,224 | 6/1989 | Hoppe ................ 257/679 |
| 4,916,506 | 4/1990 | Gagnon . |
| 4,984,062 | 1/1991 | Vemura et al. . |
| 4,985,748 | 1/1991 | Belanger, Jr. . |
| 5,068,712 | 11/1991 | Murakami et al. ........ 257/676 |

FOREIGN PATENT DOCUMENTS

| | | |
|---|---|---|
| 1179351 | 7/1979 | Japan . |
| 6097645 | 5/1985 | Japan . |
| 61-255043 | 11/1986 | Japan ................ 257/676 |
| 0031449 | 2/1989 | Japan . |
| 1122144 | 5/1989 | Japan ................ 257/676 |
| 1220464 | 9/1989 | Japan . |
| 1255260 | 10/1989 | Japan ................ 257/676 |
| 2-119255 | 5/1990 | Japan ................ 257/676 |

*Primary Examiner*—Sara W. Crane
*Assistant Examiner*—Roy Potter
*Attorney, Agent, or Firm*—Antonelli, Terry, Stout & Kraus, LLP

[57] ABSTRACT

A semiconductor device of a structure in which lateral surfaces of a semiconductor element and an element supporting member are bonded to each other without resorting to use of a base member on which the semiconductor element is disposed. Since thicknesses of the base member and a bonding resin provides no contribution to overall thickness of the semiconductor device, reduction of thickness thereof by 30 to 40% is made possible. In dependent on configuration of the element supporting member, the semiconductor device can be applied to large size elements, lead-on-chip structure (LOC) and others.

29 Claims, 17 Drawing Sheets

SEMICONDUCTOR DEVICE, LEAD FRAME THEREFOR AND MEMORY CARD TO PROVIDE A THIN STRUCTURE

RELATED APPLICATIONS

This application is a division of U.S. application Ser. No. 08/075,928 filed Jun. 14, 1993, now U.S. Pat. No. 5,391,916 issued Feb. 21, 1995 which in turn is a continuation application of U.S. application Ser. No. 07/680,522 filed Apr. 4, 1991, now abandoned.

BACKGROUND OF THE INVENTION

1. Field of the Invention

The present invention relates to a semiconductor device and a manufacturing method of the same, a lead frame employed in the semiconductor device, and a memory card and a manufacturing method of the same. More particularly, the invention is concerned with a semiconductor device and a manufacturing method of the same, a lead frame used in manufacturing the semiconductor device and a memory card composed of the semiconductor device or devices and a method of manufacturing the memory card which is suited for implementing the semiconductor device and the memory card in a thin structure.

2. Description of the Prior Art

In the manufacture of a semiconductor device known heretofore, a semiconductor element is disposed on a surface of a semiconductor element mounting plate referred to as a tab which surface is applied with a bonding resin layer. In other words, the semiconductor element is bonded at the bottom surface thereof to the tab. Subsequently, the assembly including the tab and the semiconductor element undergoes several processing steps such as wire bonding, after which the assembly is sealed by a sealing resin to complete a semiconductor device. As an example of the thin semiconductor device realized by resorting to the technique outlined above, there has already been reported a semiconductor device having a thickness of 1 mm.

Further, as the semiconductor devices where the tab is spared, there are known device structures in which a semiconductor element and inner tip end portions of leads are buried in a resin sheet for thereby enhancing temperature cycle withstanding capability (refer to, for example, JP-A-60-97645), a device in which a semiconductor element and inner tip ends of the leads are bonded together at the opposite sides (opposite lateral surfaces) thereof by using a bonding resin (refer to, for example, JP-A-H1-220464) and others.

The tab which has been used in the prior art method of manufacturing the semiconductor device must be mounted with a semiconductor element with a bonding resin layer being interposed therebetween. Under the circumstances, a sum of thicknesses of the tab, the bonding resin layer and the semiconductor element can amount to a value in the range of 0.6 to 0.7 mm in the present state of the technique. Further, taking into consideration the height of the wires for bonding, resin flow balance upon resin sealing and other factors, the attempt for reducing the thickness of the semiconductor device to a value smaller than 1 mm will encounter a great difficulty.

The technique disclosed in JP-A-60-67645, is inherently and basically concerned with a method of mounting a semiconductor element on a sheet of resin. Thus, it is practically impossible to reduce the thickness of the semiconductor device by relying on this prior art method.

According to the technique disclosed in JP-A1-220464, a semiconductor device can certainly be implemented in a thin structure because the thickness of the lead frame and the bonding resin layer can be accommodated or absorbed by the thickness of a semiconductor element. However, since the bonding resin has to be applied to the inner tip ends of the leads, there may arise some problems that the wire bonding becomes difficult, the plane of the leads is caused to bulge upwardly and/or positional misalignment or diversity may occur among the inner lead end portions after the bonding.

SUMMARY OF THE INVENTION

An object of the present invention is therefore to eliminate the shortcomings of the prior art techniques described above by providing a lead frame and a semiconductor device as well as a memory card including the semiconductor device or devices which can be implemented in very thin structures.

In view of the above and other objects which will be apparent as description proceeds, it is taught according to a general aspect of the invention that in place of mounting a semiconductor element on a lead frame, side (lateral) surface or surface portion of the semiconductor element is bonded to oppositely disposed lateral surface or surface portion of an element supporting part or parts (also referred to as the element suspending member or members) disposed around a region where the semiconductor element is disposed, while providing means for electrically insulating the semiconductor element and the element supporting member(s), whereon the assembly thus prepared and including the semiconductor element and the lead frame is finally sealed by a sealing resin and shaped as desired.

As concrete examples of the means for electrically insulating the semiconductor element and the element suspending part(s) from each other, there may be mentioned (1) interposition of a high-molecular bonding agent between the semiconductor element and the element supporting part, (2) interposition of cushion(s) of elastic material, (3) use of the element supporting part made of an electrically insulating material and others.

Now, the subject matters of the present invention will be described.

Lead Frame

A lead frame according to an aspect of the invention may include a group of leads (also referred to as lead group) serving as intermediate parts for external electrical connection of a semiconductor element and a dummy lead part or parts having side or lateral surfaces (end surfaces) facing, when disposed, in opposition to the side or lateral surface(s) of the semiconductor element. As the alternative, the lead frame may include the lead group mentioned above and an element suspending member or member(s) defining the position at which a semiconductor element is to be disposed.

The dummy lead part(s) or the element suspending member(s) may be formed integrally with the lead group. However, in principle, in the completed state of the semiconductor device, the dummy lead part(s) or the element suspending part(s) has already been cut or is to be cut. In a version of the lead frame according to the invention, the base or substrate for the lead frame may be formed of an electrically insulating material, wherein electrically conducting layers are applied to those portions which are to serve as the leads, while the remaining leads (i.e. those portions where no electrically conducting layers are formed) are used as the dummy lead parts or the element suspending parts.

Semiconductor Device

A semiconductor device provided according to an aspect of the present invention is a so-called resin sealed package and comprises a semiconductor element, a group of leads or a lead frame serving for external electric connection of the semiconductor element, connecting members (such as wires, tapes, bumps or the like) for electrically interconnecting the individual leads of the lead group or the lead frame and the semiconductor element, a sealing layer for sealing the connecting members, the semiconductor element and portions of the individual leads of the lead group or the lead frame.

The semiconductor device according to the aforementioned concept of the invention features structures mentioned below.

(1) Dummy leads are provided separately from the leads of the lead group on a same plane as the lead group, wherein dummy leads are disposed with lateral surfaces thereof facing in opposition to the lateral surfaces, respectively, of the semiconductor element.

(2) An element suspending member is provided separately from the lead group and dedicated for supporting the semiconductor element, and the semiconductor element is bonded to lateral surface of the element suspending member by means of a bonding member.

(3) The group of leads is constituted by a predetermined electrically insulating member which has a surface formed with electrically conductive layers which serve for the external electric connection of the semiconductor element, wherein the semiconductor element is bonded at lateral surfaces thereof to those portions of the electrically insulating member which are exposed at lateral surfaces thereof by a bonding agent.

(4) The lead frame is constituted by a predetermined electrically insulating member which has a surface formed with an electric conductor pattern to serve for the external electric connection of the semiconductor element, wherein the lead frame is formed with a through-hole for receiving therein the semiconductor element of which only the lateral surfaces are bonded to those portions of lateral surfaces of the electrically insulating member which are exposed to the through-hole.

(5) A sealing resin is interposed between the semiconductor element and the lead group, wherein a bonding agent layer is formed on lateral surfaces of the semiconductor element in addition to the sealing resin, and one end portion of the bonding agent layer is exposed externally of the semiconductor element.

(6) A semiconductor device is obtained in which a surface of the semiconductor element having a circuit formed thereon lies in a same plane as wire-connected portions of the leads. Alternatively, there is obtained a semiconductor device in which a semiconductor element and a part of the leads are attached to a same surface of the electrically insulating film to be temporarily fixed thereto while the semiconductor element among others is so disposed that the surface thereof having a circuit formed thereon faces in opposition to the electrically insulating film, wherein projections of electrode pads of the semiconductor element in the direction orthogonal to the plane of the semiconductor device do not assume positions which are superposed on the electrically insulating film, and wherein after having formed the electric connection by the wires, a sealing resin is applied, being followed by removal of unnecessary portions by cutting. As another alternative, there is obtained a semiconductor device in which a semiconductor element and a tab are temporarily secured together by mounting the semiconductor element on the tab with a bonding agent being interposed therebetween so that the surface of the semiconductor element having a circuit formed therein faces the tab, wherein electrode pads of the semiconductor element are so disposed that projections of the electrode pads in the direction orthogonal to the plane of the semiconductor device are not superposed on the tab, and wherein after formation of the predetermined electric connection by the wires, a sealing resin is applied, and unnecessary portions are cut sway.

In manufacturing the semiconductor devices according to the invention, the following features may preferably be adopted individually or in combination.

(a) The dummy leads or the element suspending member are formed of the same material as the leads of the lead group.

(b) The dummy leads or the element suspending member are formed of an electrically conductive material.

(c) The dummy leads or the element suspending member are of a same material as the leads or an electrically conductive material, wherein the dummy leads or the element suspending member have undergone a predetermined insulation processing at least on a surface thereof which faces in opposition to the lateral surface of the semiconductor element.

(d) The dummy leads or the element suspending member are formed of an electrically insulating material.

(e) The lateral or side surface of the semiconductor element which faces in opposition to the lateral surface of the dummy lead (or that of the element suspending member) is formed with a longitudinal groove.

(f) The dummy lead (or the element suspending member) has a portion which extends substantially in parallel with the lateral surface of the semiconductor element.

(g) The whole thickness including those of the semiconductor element and the sealing resin layer is preferably smaller than 1.0 mm and more preferably smaller than 0.7 mm. The semiconductor device having a thickness not greater than 0.7 mm is an epoch-making device.

(h) Only a sealing resin exists within a gap of minimum distance between two lateral surfaces of the semiconductor element and the lead to which the wire is connected.

(i) A lead having a portion extending substantially in parallel with at least one of the lateral or side surfaces of the semiconductor element is provided, wherein the lead is applied with an electrically insulating film.

(j) Opposite portions of the lateral surfaces of the semiconductor element and those of the individual leads connected to the electrode pads by wires exist at least in one-to-one correspondence.

(k) The leads are bent such that upon mounting or packaging of the semiconductor element on a predetermined substrate, the surface of the semiconductor element on which a circuit is formed or a rear surface thereof faces in opposition to the substrate.

(l) At least a slit or hole (aperture) is so provided in the insulating film as to extend through it in the thicknesswise direction.

(m) In conjunction with the structural feature (6) mentioned above, the maximum height of a loop formed by the wire interconnecting electrically the electrode pad and the lead as measured from a reference plane defined by the surface of the semiconductor element having a circuit formed thereon is greater than the thickness of the electrically insulating film.

(n) The rear surface of the semiconductor element opposite to the surface having a circuit formed thereon is exposed exteriorly.

(o) The abovementioned rear surface of the semiconductor element lies on the same plane as either one of the external surfaces of the semiconductor device.

(p) At least a part of slits or apertures (holes) exist in a region where both surfaces of the electrically insulating film are brought into contact with the sealing resin.

Adhesives and Bonding Agents

In the semiconductor device according to the present invention, it is necessary and sufficient that the adhesive or the bonding agent exerts no adverse influence to the leads serving for external connection of the semiconductor element. This requirement can be met by a method for realizing a provisional fixing of the leads in the course of manufacturing process. By way of example, the leads and the semiconductor element may be provisionally or temporarily secured together by using a rear surface of an adhesive tape or film (in this case, the platform or jig mentioned below constitutes the adhesive film or tape) or by injecting a settable adhesive composition or alternatively forming grooves in the cushion members for receiving fittingly therein the semiconductor element. As the adhesive, a sealing resin composition may advantageously be employed as the adhesive in pulverized form or liquid phase.

Method of Manufacturing Semiconductor Devices

The method of manufacturing the semiconductor device according to the invention may generally be classified into four types mentioned below.

A first type of method of manufacturing the semiconductor device comprises the steps of disposing on a jig provided with an adhesive injection port a semiconductor element and a lead frame including an element suspending member and electrical connecting parts, securing together the semiconductor element and the lead frame by injecting a bonding agent through the adhesive agent injection port between a lateral surface of the semiconductor element and that of the element suspending member, removing the semiconductor element and the lead frame from the jig, and sealing by a resin the semiconductor element and a portion of the lead frame located close to the semiconductor element.

A second type of method of manufacturing a semiconductor device comprises the steps of disposing on a platform a semiconductor element and a lead frame including an element suspending member and electrical connecting parts, securing together the semiconductor element and the lead frame by pouring or dropping a bonding agent between a lateral surface of the semiconductor element and that of the element suspending member, separating the semiconductor element and the lead frame from the platform, and sealing by a sealing resin the semiconductor element and a portion of the lead frame located close to the semiconductor element.

In modes for carrying out the methods of manufacturing the semiconductor devices described above, it is preferred that after securing by the bonding agent, the semiconductor element and the lead frame are separated by cutting along the position of the bonding agent, after which the sealing by the resin is performed or alternatively the cutting is performed after the sealing by the resin.

A third type of method of manufacturing a semiconductor device comprises the steps of disposing on a platform a lead frame including element suspending members equipped with cushion materials, respectively, and electrical connecting parts, the element suspending members being so disposed that the cushion materials face in opposition to each other, fitting fixedly a semiconductor element between the cushion materials, removing the lead frame and the semiconductor element from the platform, and sealing by a resin the semiconductor element and a portion of the lead frame located close to the semiconductor element.

According to a fourth method, there is obtained a semiconductor device in which a semiconductor element is so disposed that its surface having a circuit formed therein lies on the same plane as wire-connected parts of the leads. Alternatively, the semiconductor element and portions of the leads are attached to the same surface of an electrically insulating film to be temporarily fixed thereto while the semiconductor element is so disposed that the surface thereof having a circuit formed thereon faces in opposition to the electrically insulating film and that projections of electrode pads of the semiconductor element in the direction orthogonal to a plane of the semiconductor device do not assume the positions which overlie the electrically insulating film, whereon after electric connection having been formed by the wires, a sealing resin is applied, being followed by removal of unnecessary portions by cutting. As the further alternative, the semiconductor element and a tab are temporarily secured together by mounting the semiconductor element on the tab with a bonding agent being interposed therebetween, wherein the semiconductor element is so disposed that the surface thereof having a circuit formed thereon faces in opposition to the tab and that projections of electrode pads of the semiconductor element in the direction orthogonal to a plane of the semiconductor device do not assume positions which overlie the tab, and wherein after having formed electric connection by the wires, a sealing resin is applied, being followed by removal of unnecessary portions by cutting, whereby a semiconductor device is completed.

In any of the semiconductor device manufacturing methods, it is self-explanatory that a resin sealing is performed after the wire bonding or equivalent electric wiring.

Memory Cards

A memory card according to the present invention is characterized by incorporation of any one of the resin-sealed semiconductor devices described above and thus provides a package part covered with double resin layers. When only one semiconductor device is incorporated which can be implemented with a thickness smaller than 1 mm, there can be realized a memory card having an overall thickness not exceeding 2.0 mm without incurring low yield. When two semiconductor devices are incorporated, the memory card can be implemented with an overall thickness not exceeding 2.5 mm. Alternatively, the semiconductor device by itself may be used intact as a memory card.

Further, the memory card according to the invention may have any one of four structures mentioned below.

(1) One resin-sealed semiconductor device is mounted on a substrate, whereon leads of the semiconductor device are connected to a circuit or circuits implemented in the substrate. The assembly thus obtained is wholly covered with a resin such that the whole thickness including that of the resin amounts to less than 2.0 mm.

(2) Two resin-sealed semiconductor devices are disposed on both surfaces of a single substrate, whereon leads of the semiconductor devices are connected to circuit(s) of the substrate. The assembly thus obtained is wholly covered with a resin such that the overall thickness inclusive of that of the resin is not greater than 2.5 mm.

(3) The semiconductor devices according to the invention are mounted on both surfaces of a substrate, respectively, included in a memory card.

(4) The semiconductor device according to the invention constitutes by itself a memory card.

In a typical method of manufacturing a memory card according to the invention, the resin-sealed semiconductor device described hereinbefore is mounted on a substrate. After forming electric connection to a circuit or circuits incorporated in the substrate, the assembly including the semiconductor device and the substrate is covered with a package member.

For manufacturing the memory card, IC card manufacturing techniques may equally be used.

Connection of Element and Leads

For this connection, there may be employed in addition to a wire bonding, a bump, TAB (tape-automated bonding) and other suitable methods.

Other Features

The element suspending member (or dummy leads) and the bonding agent interposed between the suspending member and a semiconductor element may eventually be cut and removed. More or less projections of the bonding agent over the element suspending member (or dummy leads) can be permitted so far as the product and the manufacturing method do not suffer from any appreciable adverse influence. By using a bonding agent of an organic series, close adhesion among the sealing resin, the semiconductor element and the leads (or lead frame) can further be enhanced to additional advantage. The bulging-out of the adhesive onto the electrically conductive leads and the semiconductor element should intrinsically be prevented because otherwise obstacle is presented to the wire bonding. However, bulging-out or covering of the adhesive on or over those regions where the bonding encounters no difficulty can be permitted. Besides, the portions of the dummy leads and the semiconductor element which are fixed together may be portions of gaps interposed between the dummy leads and the semiconductor element, so far as the provisional fixing of them can be assured.

With the aid of the measures described above, the thickness of the lead frame which is generally smaller than that of the semiconductor element is absorbed, so to say, by the thickness of the semiconductor element. Further, the bonding resin interposed between the lead frame and the semiconductor element contributes no more to increasing of the thickness of the semiconductor device. Accordingly, in the case where the thickness of the semiconductor element and that of the bonding resin are the same as those used heretofore, there can necessarily be realized a thinner structure of the semiconductor device. Besides, by adopting the means or arrangements described above, the internal structure of the semiconductor device is symmetrical relative to the center of a section of the device, and the sealing resin can flow more uniformly as compared with the structures of the devices known heretofore, which in turn means that the device can be manufactured more easily or conveniently even when the thickness of the sealing resin is reduced, whereby the thickness of the semiconductor device as finished can be further reduced.

In the semiconductor device and the memory card, the element suspending leads remaining in the device serve for an auxiliary function of reinforcing and protecting the device and the card against bending and torsion otherwise occurring under the influence of external forces. Further, since the element suspending leads are provided separately from the electrically conducting leads, the semiconductor element can be formed in as great a size as the leads permit.

By virtue of the structure in which the insulating film or tab is disposed on a surface of the semiconductor element on which circuit and hence electrode pads are formed such that the film or tab overlie none of the pads, the thickness of the insulating film or tab can be absorbed by or accommodated within the height of loops formed by the wires and plays no part in determination of the thickness of the semiconductor device. Accordingly, there can be realized a thinner semiconductor device when compared with the prior art TSOP (abbreviation of Thin Small Outline Package) even for a same thickness in other portions as the latter. In the TSOP, the overall thickness of the tab and the bonding agent layer is on the order of 0.2 mm. Consequently, according to the teaching of the invention, the semiconductor device can readily be manufactured in a thickness of 0.8 mm (=1.0 mm−0.2 mm) even by resorting to the present state of transfer molding process. Moreover, in consideration of the facts that the tab exhibiting a relatively low adhesion strength can be spared and that the sealing resin can flow and spread uniformly to thereby allow the thickness of the sealing resin to be reduced, the semiconductor device can be manufactured in a thickness of a range of 0.5 to 0.7 mm. Thus, the memory card including a substrate having both surfaces mounted with two semiconductor devices, respectively, can also be manufactured in a thickness sufficiently small for practical applications, even taking into account the thickness contribution of the external leads.

Unless thermoset resin is used, the electrode pads of the semiconductor element can be protected from contamination. Besides, since the lead frame then undergoes no thermal contraction, positional misalignment of the lead frame can positively be suppressed.

With the semiconductor device according to the invention, repair and burn-in testing can be performed. Besides, because the semiconductor device can be mounted or packaged on each of the surfaces of the substrate, there can be obtained a memory card of a significantly increased storage capacity.

In a mode for carrying out the invention, the semiconductor element is not packaged on an element mount member (i.e. tab) but supported at a lateral surface by an element suspending member bonded thereto by a resin. Thus, the thicknesses of the tab and the bonding resin exert no influence on the thickness of the semiconductor device. Besides, because of uniform flow and spreading of the sealing resin, the thickness of the latter can be reduced. Thus, by applying the teachings of the present invention to the semiconductor device, the latter can be thinned about 35 to 45% when compared with the prior art device. Further, an IC card in incorporating the semiconductor device can correspondingly be decreased in thickness, whereby an improved IC card is made available.

In should further be mentioned that, according to the teachings of the invention, there can be obtained semiconductor devices which enjoy higher reliability when compared with the prior art device even in a temperature cycle test or in a high temperature environment, and which can be realized in a thickness far smaller than that of the TSOP and packaged or mounted on both surfaces of a substrate in a memory card, and in which the electrode pads of the semiconductor element are protected against contamination due to use of an adhesive while the lead frame is made insusceptible to positional dislocation which may otherwise occur due to thermal contraction.

DESCRIPTION OF THE PREFERRED EMBODIMENTS

Now, the present invention will be described in detail in conjunction with exemplary or preferred embodiments thereof by reference to the accompanying drawings.

Figure 1:
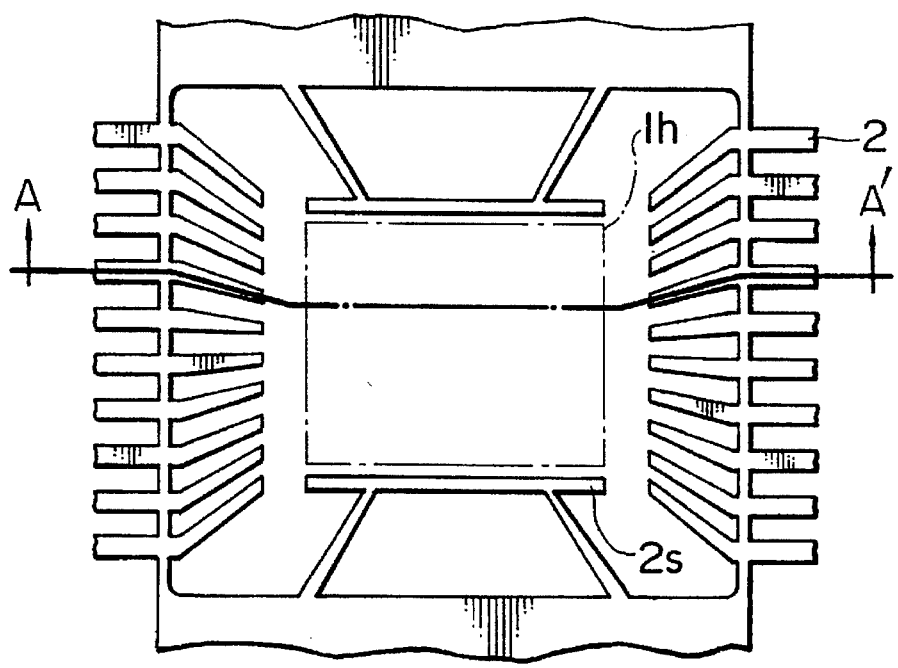
FIG. 1 is a top plane view showing a lead frame according to a first embodiment of the invention.
Figure 2:
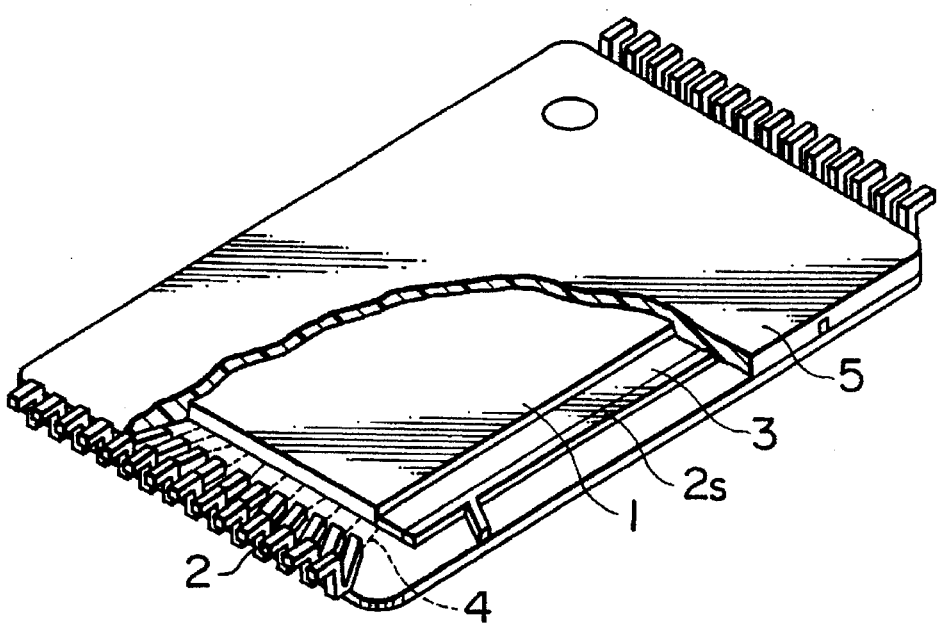
FIG. 2 is a perspective view showing a semiconductor device according to the first embodiment with a portion being broken away.

FIG. 1 shows a lead frame for a semiconductor device according to a first embodiment of the present invention, and FIG. 2 is a perspective view showing the semiconductor device of FIG. 1 with a sealing resin 5 being partially removed in the state in which a surface disposed in opposition to a mounting substrate faces upwardly.

Referring to FIG. 1, there exist no tabs at an element locating position 1h indicated by a single-dot broken line, and element suspending or supporting members 2s are provided at two sides of the lead frame at which no leads 2 are provided. On the other hand, in the state shown in FIG. 2, a semiconductor element 1 is disposed at a predetermined position, wherein bonding resin layers 3 are interposed between lateral surfaces of the semiconductor element 1 and the element supporting or suspending members 2s for securing together both the element 1 and the supporting members 2s until they are sealed by the sealing resin. 5. For the bonding 3, a high-molecular adhesive is usually employed which exhibits electrical insulation and high thermal stability. After having formed electric connections by wires 4 between the semiconductor element 1 and the leads 2, the sealing resin 5 is applied, whereon the semiconductor device is obtained. Parenthetically, it should be mentioned that the element suspending member 2s may also be provided at the other two sides of the lead frame where the lead groups 2 are formed.

Figure 3:
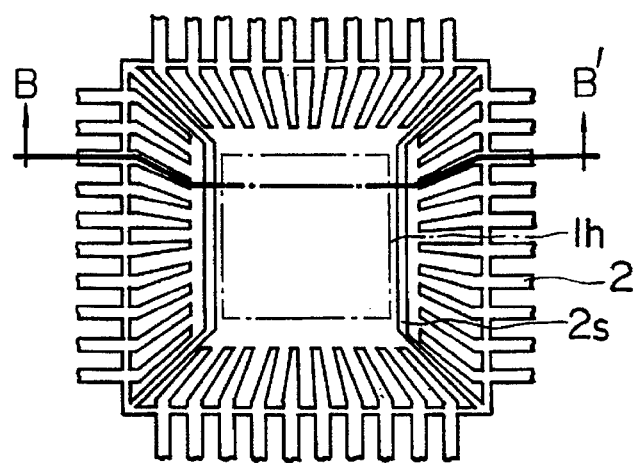
FIG. 3 is a top plane view showing a lead frame according to a second embodiment of the invention.

FIG. 3 shows a lead frame for a semiconductor device according to a second embodiment of the invention. As can be seen in the figure, the teaching of the present invention can equally be applied to the semiconductor device to similar advantageous effect even in the case where the lead groups are formed or developed along the four sides of the frame, respectively.

Figure 4:
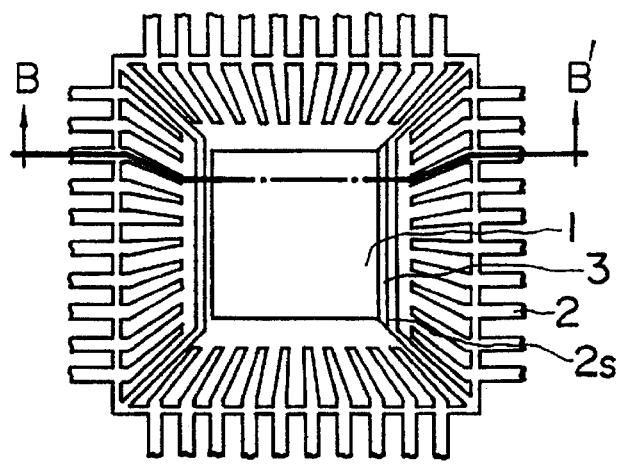
FIG. 4 is a top plane view showing the lead frame of FIG. 3 in the state after a semiconductor element has been assembled in the frame.

FIG. 4 shows a semiconductor device in the state in which a semiconductor element 1 is assembled in the lead frame illustrated in FIG. 3 with gaps being filled with a bonding resin.

Figure 5:
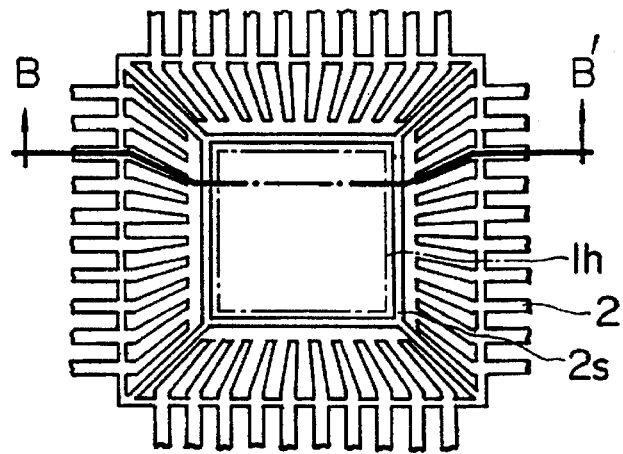
FIG. 5 is a top plane view showing a lead frame according to a third embodiment of the invention.
Figure 7:
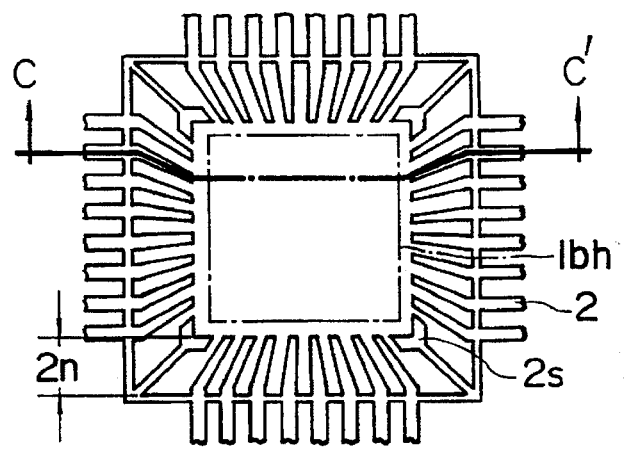
FIG. 7 is a top plane view showing a lead frame according to a fourth embodiment of the invention.

FIGS. 5 and 7 show lead frames for semiconductor devices according to third and fourth embodiments of the invention. In the case of the lead frame structure shown in FIG. 5, an integral element suspending member 2s is so formed as to enclose completely the outer periphery of a semiconductor element. With this lead frame structure, strength of the completed semiconductor device can be increased against bending stress or other detrimental deformation brought about by external forces. On the other hand, in the case of a lead frame structure shown in FIG. 7, there are provided four separate suspending members 2s which are adapted to support the semiconductor element 1 at four corners thereof, respectively. By virtue of this structure, no element suspending portions are interposed between the semiconductor element 1 and the leads 2, which in turn means that a larger size of semiconductor element (having an outer periphery 1bh) can be installed for a same internal lead length 2n as that of the prior art lead frame.

Figure 6:
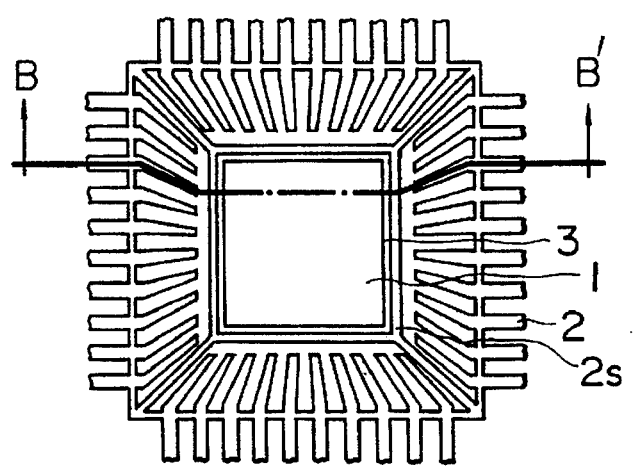
FIG. 6 is a top plane view showing the lead frame of FIG. 5 in the state after a semiconductor element has been assembled in the frame.
Figure 8:
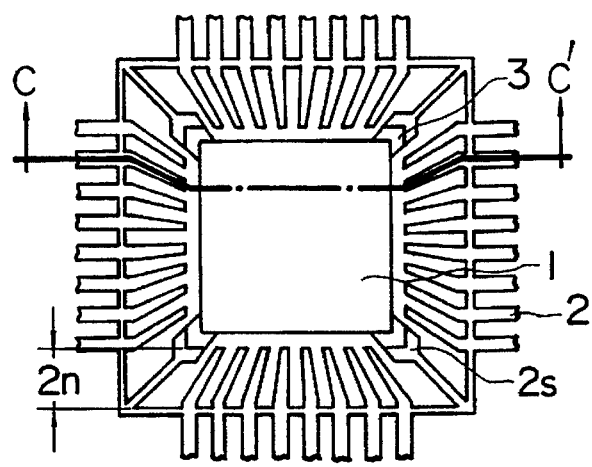
FIG. 8 is a top plane view showing the lead frame of FIG. 7 in the state after a semiconductor element has been assembled in the frame.

FIG. 6 shows the lead frame of FIG. 4 in the state in which the semiconductor element 1 has been assembled with the gaps being filled with a bonding resin. FIG. 8 shows the lead frame of FIG. 7 in the state similar to that shown in FIG. 6.

At this juncture, it is to be noted that all the lead frames of FIG. 3, FIG. 4, FIG. 5, FIG. 6, FIG. 7 and FIG. 8 are shown in the state before the respective lead terminals are cut.

Figure 9:
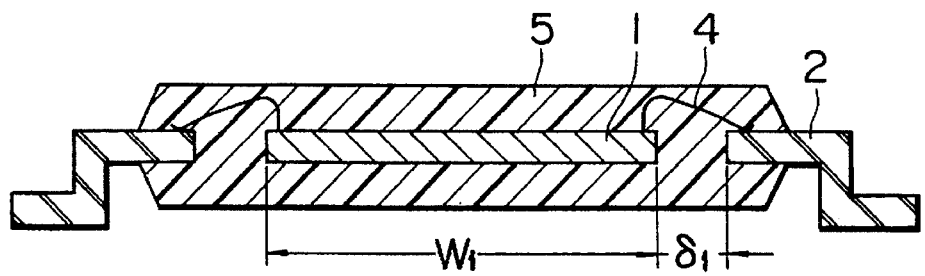
FIG. 9 is a sectional view taken along a line A–A' in FIG. 1.
Figure 10:
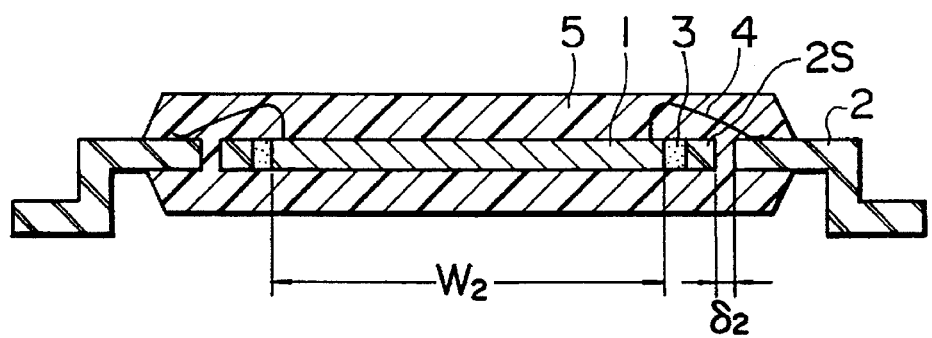
FIG. 10 is a sectional view taken along a line B–B' in FIG. 3 as well as FIG. 4, FIG. 5 and FIG. 6.
Figure 11:
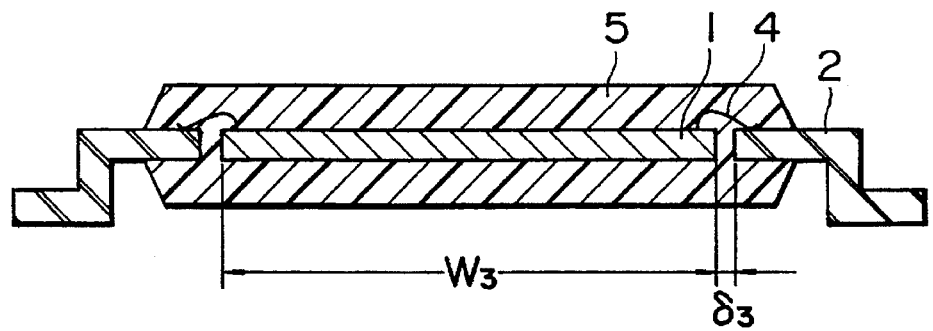
FIG. 11 is a sectional view taken along a line C–C' in FIG. 7 and FIG. 8.

FIG. 9 is a sectional view of the semiconductor device taken along a line A–A' in FIG. 1, FIG. 10 is a similar sectional view taken along a line B–B' in FIG. 3 (as well as FIG. 4 to FIG. 6), and FIG. 11 is also a similar sectional view taken along a line C–C' in FIGS. 7 and 8, wherein the respective semiconductor devices are shown in the state after having been sealed.

As the parameters characterizing the semiconductor devices shown in FIG. 9 to FIG. 11, W1 to W3 represent the widths of the semiconductor elements 1 in the devices shown in these figures, respectively, while $S_1$ to $S_8$ represent the gaps or distances between the leads 2 and the semiconductor elements 1 or between the leads 2 and the element suspending members 2s of the devices, respectively. Then, the following valid relations apply.

$$W_1 = W_2, W_1 < W_3$$

$$\delta_1 > \delta_2, \delta_2 = \delta_3$$

Figure 12:
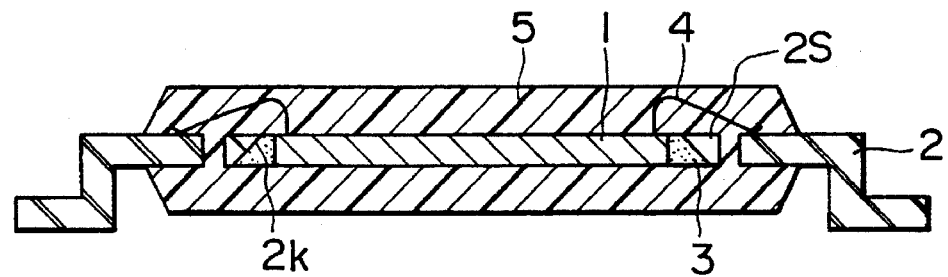
FIG. 12 is a sectional view of a semiconductor device according to a fifth embodiment of the invention.

Next, the description will be turned to embodiments of the invention concerning an improved method of bonding the semiconductor element and the element suspending members on the assumption that the semiconductor device is of a basic structure corresponding to the sectional view of FIG. 10 and incorporates the lead frame according to the third embodiment of the invention Referring to FIG. 12 which shows a semiconductor device according to a fifth embodiment of the invention, the element suspending member 2s is provided with an oblique or beveled surface 2k with a view to enlarging the area of the element suspending member 2s over which the bonding resin 3 is to be deposited. With this structure, not only the bonding strength but also the manufacturing yield can significantly be increased.

Figure 13:
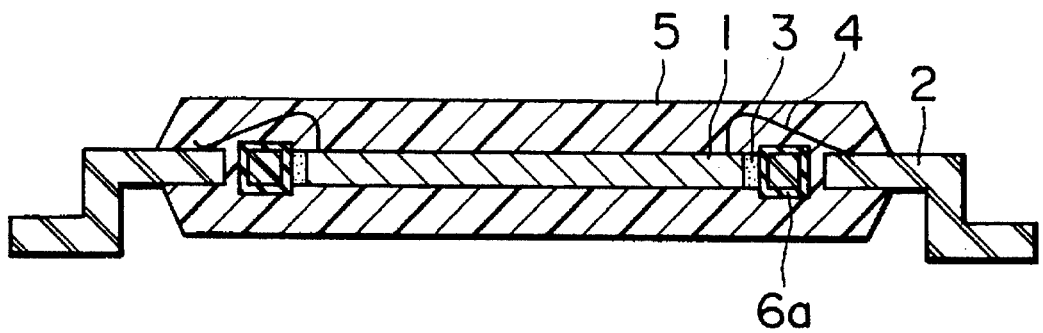
FIG. 13 is a sectional view of a semiconductor device according to a sixth embodiment of the invention.

Referring to FIG. 13 which shows a semiconductor device according to a sixth embodiment of the invention, an insulation coat 6a is applied over the surface of the element suspending member 2s. The insulation coat 6a is effective to prevent a short circuit from being formed between a semiconductor element 1 and the element suspending member due to positional deviation of the semiconductor element 1 upon disposition in the lead frame.

Figure 14:
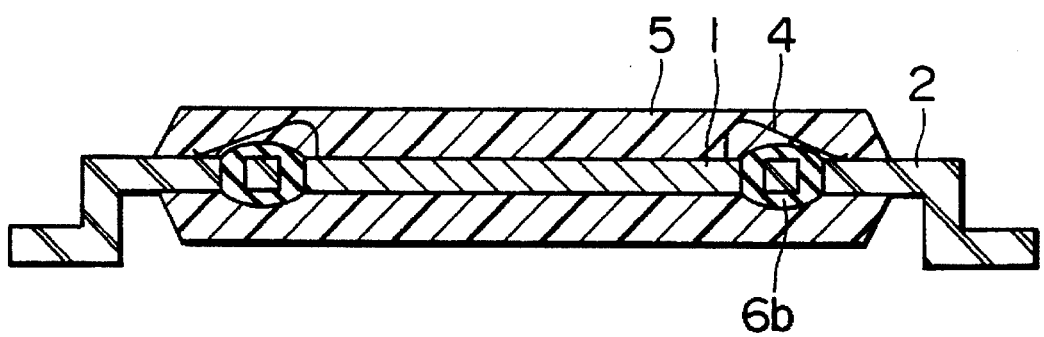
FIG. 14 is a sectional view of a semiconductor device according to a seventh embodiment of the invention.

Referring to FIG. 14 which shows a semiconductor element according to a seventh embodiment of the invention, an electrically insulating cushion or pad 6b is deposited on the whole surface of the element suspending member 2s. The electrically insulating cushion 6b serves to secure the semiconductor element 1 upon disposition thereof by taking advantage of elastic force of the cushion 6b applied onto the outer periphery of the semiconductor element. Thus, in the case of the semiconductor device of this embodiment, use of the bonding resin becomes unnecessary for fixedly disposing the semiconductor element 1 in the lead frame. Incidentally, the cushion 6b should preferably be formed of a silicone rubber in view of the high elasticity, thermal stability, low water absorption property and other properties of this material.

Figure 15:
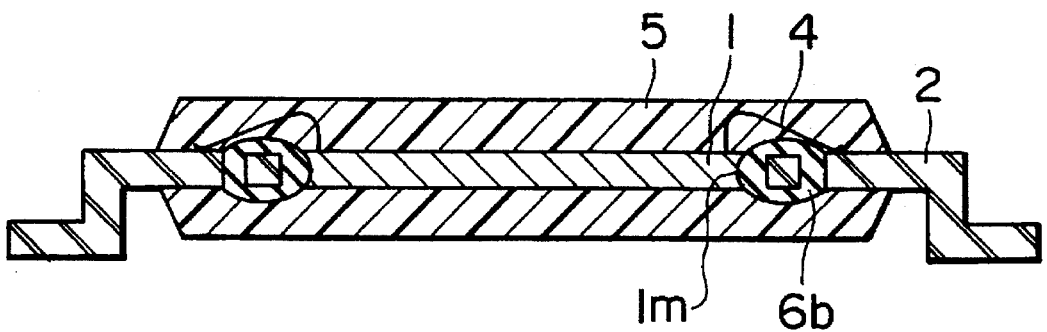
FIG. 15 is a sectional view of a semiconductor device according to an eighth embodiment of the invention.

Referring to FIG. 15 which shows a semiconductor device according to an eighth embodiment of the invention, each surface of the longer sides of a semiconductor element which faces in opposition to the element suspending member 2s is formed with a groove 1m of an arcuate section in the longitudinal direction lengthwise of the longer side. This groove is adapted for receiving therein the cushion 6b described above in conjunction with the seventh embodiment when the semiconductor element is disposed, as a result of which the bonding or coupling strength between the semiconductor element 1 and the element suspending member 2s as well as the element positioning accuracy can be increased to further advantage.

It will be self-explanatory that the mounting structures described above by reference to FIG. 12 to FIG. 15 can readily be applied to all of the element suspending members of the configurations mentioned previously. Parenthetically, although the leads as well as the element suspending members have been assumed to be formed by using an electrically conductive material, the lead frame may be formed by an electrically insulating material, electrically conductive layers may be deposited on the top surfaces of the lead frame.

Figure 16:
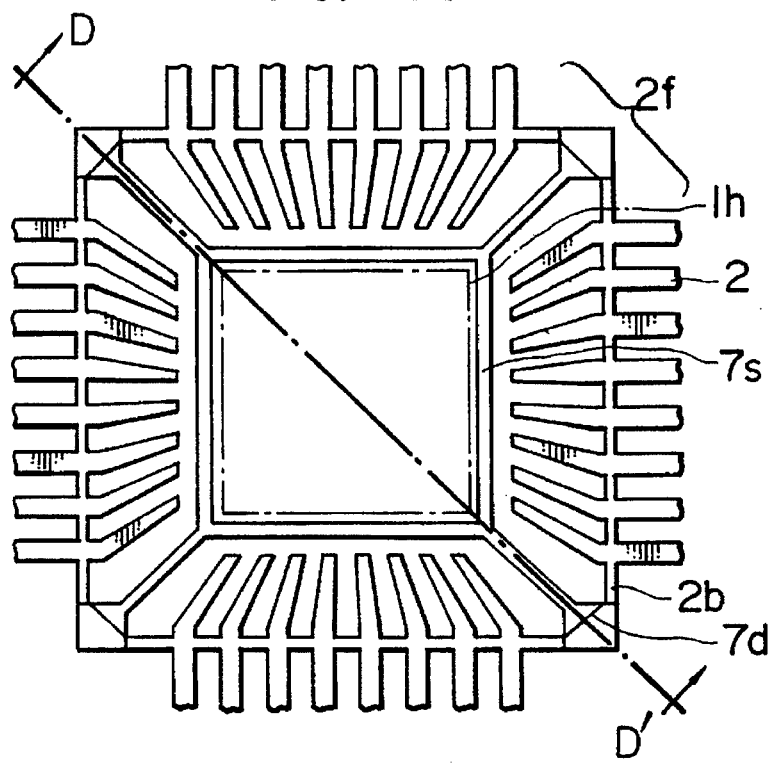
FIG. 16 is a top plane view showing a lead frame according to a ninth embodiment of the invention.
Figure 17:
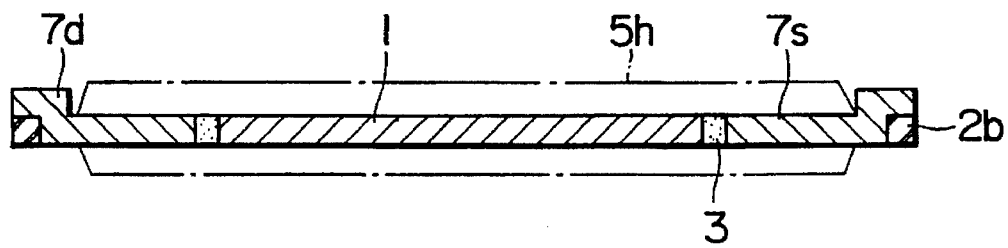
FIG. 17 is a sectional view taken along a line D–D' in FIG. 16.

FIG. 16 shows a lead frame of a semiconductor device according to a ninth embodiment of the invention, and FIG. 17 shows a section taken along a line D–D' in FIG. 16 in the state where a semiconductor element is bonded to the lead frame.

In the case of the instant embodiment, an element suspending member 7s is formed of a relatively hard electrically insulating material such as a ceramic, refractory plastic or the like, separately from a lead frame 2f. As can be seen in FIG. 17, the element suspending member 7s is disposed on a cut bar 2b of the lead frame 2f and provided with offset portions 7d so that the element supporting member 7s assumes the same height as the lead frame 2f at a center portion of the semiconductor device. The succeeding manufacture steps for completing the semiconductor device are the same as in the case of the first embodiment. The configurations of the element suspending members described previously in conjunction with the second to fourth embodiments may also be applied to the element suspending member 7s of the instant embodiment. Besides, bonding of the semiconductor element 1 and the element suspending member 7s may be carried out in the same manner as in any one of the fifth to eighth embodiments as previously described.

It should be mentioned that the offset portion 7d is finally to be eliminated by cutting, as will be appreciated from an outer profile of the sealing resin layer indicated by a single-dot broken line 5h, and thus the offset portion 7d exerts no influence to the semiconductor device itself.

In the case of the instant embodiment, since the element suspending member 7s itself is formed of an electrically insulating material, there is no need for applying the insulation coat over the member 7s, differing from the sixth embodiment.

Figure 18:
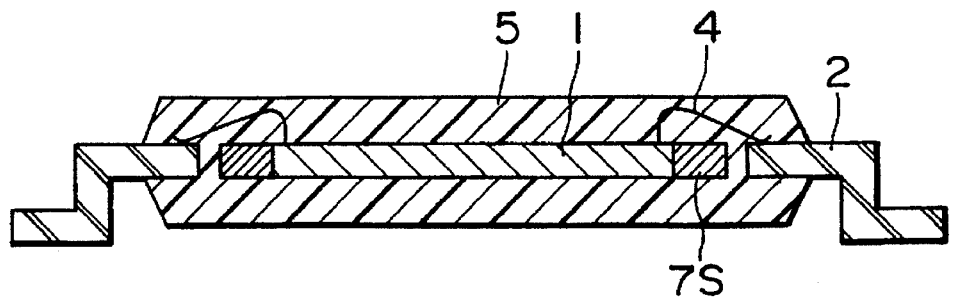
FIG. 18 is a sectional view of a semiconductor device according to a tenth embodiment of the invention.

FIG. 18 is a sectional view showing a semiconductor device according to a tenth embodiment of the invention. Referring to the figure, an element suspending member 7s is formed of an electrically insulating material, as in the case of the ninth embodiment, but differs from the latter in that a certain degree of elasticity is imparted to the element suspending member 7s according to the instant embodiment. This is for the purpose of securing the semiconductor element 1 by taking advantage of elasticity of the suspending member 7b, as described hereinbefore in conjunction with the seventh embodiment. Parenthetically, even the element supporting member formed of an electrically conducting material may be implemented so as to inhibit similar effect by providing appropriate insulating means.

Figure 19:
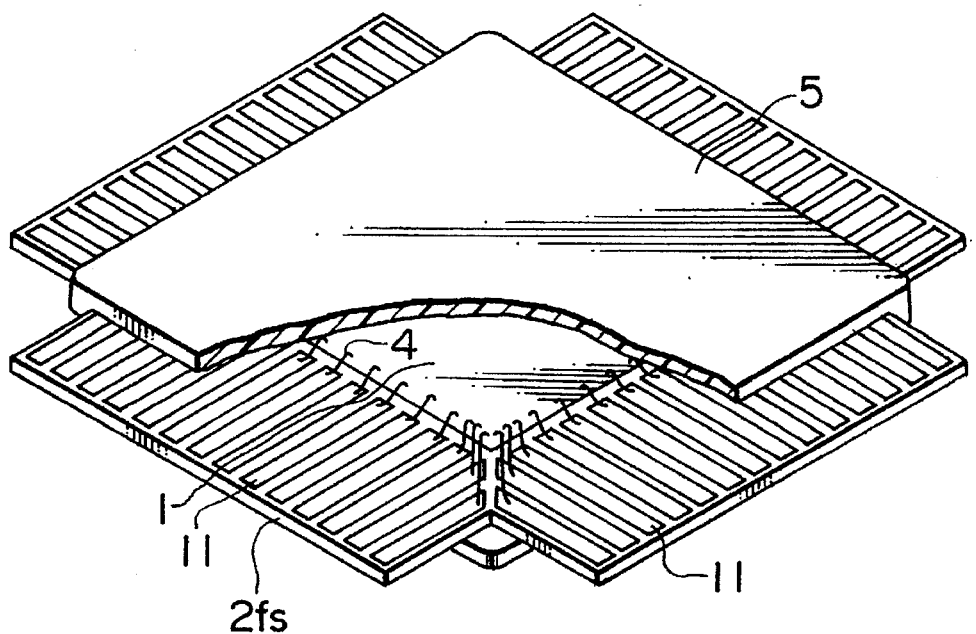
FIG. 19 is a perspective view showing a semiconductor device according to an eleventh embodiment of the invention with a portion being broken away.
Figure 20:
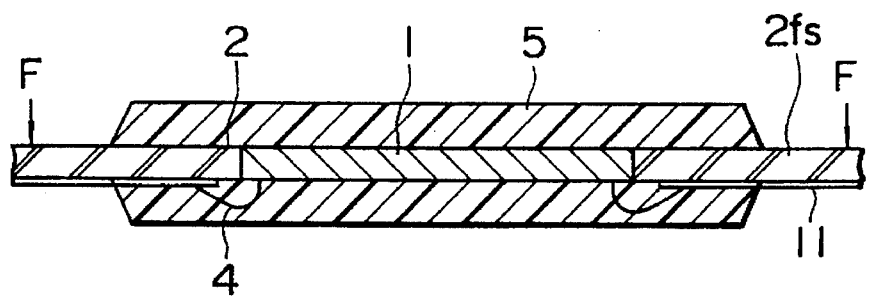
FIG. 20 is a sectional view of the semiconductor device of FIG. 19 taken in a thicknesswise direction.
Figure 21:
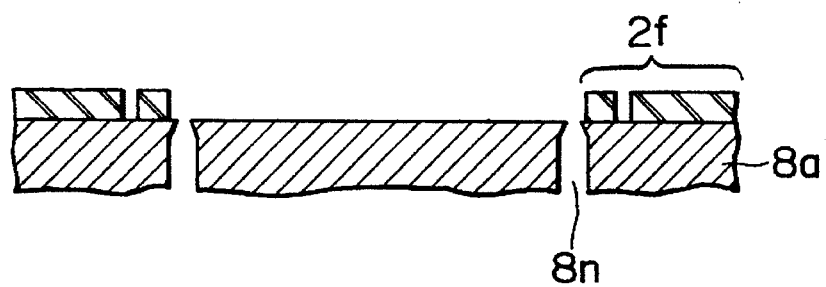
FIGS. 21, 22, 23 and 24 are sectional views showing sequentially steps of manufacturing a semiconductor device according to an embodiment of the invention.
Figure 22:
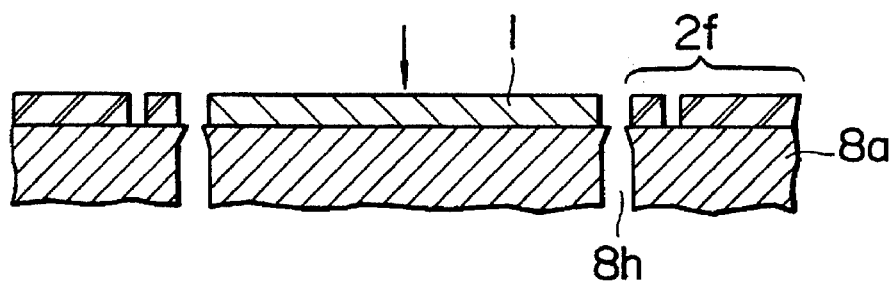
Figure 23:
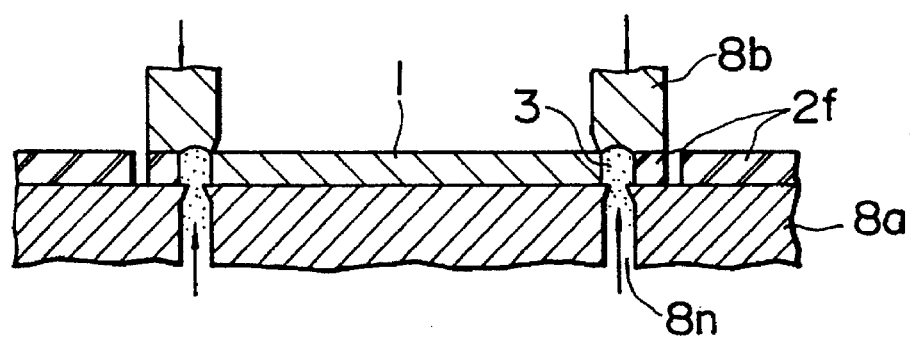
Figure 24:
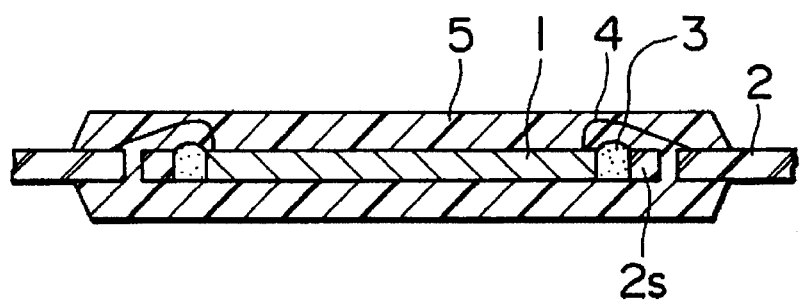

FIG. 19 is a perspective view showing a semiconductor device according to an eleventh embodiment of the invention with a sealing resin layer being partially broken away, the device being so oriented that the surface opposite to a mounting substrate faces upwardly. Further, FIG. 20 is a sectional view of the device taken in the direction thicknesswise thereof.

In the case of the instant embodiment, a lead frame 2fs is formed of an elastic insulating material such as silicone rubber or the like, wherein the surface of the lead frame 2fs facing toward a mounting substrate is provided with electrically conducting patterns 11. The semiconductor element 1 is disposed with the surface having electrodes formed thereon facing upwardly so that electrical connection between electrodes of the element and the patterned electric conductors can be facilitated.

Also in the case of the instant embodiment, the semiconductor element 1 is bonded to the element suspending member 2 only at the side or lateral surfaces of the element 1 similarly to the preceding embodiments.

Since the lead frame is formed of an elastic material, direct bonding can be realized between the semiconductor element 1 and the suspending member.

Mounting of the semiconductor device thus manufactured to a substrate is carried out by applying an external force to the device from the above to thereby cause the patterned electrical conductors 11 to bear on the mounting substrate under pressure, as is illustrated in FIG. 20.

Now, description will be directed to methods of manufacturing the semiconductor devices according to the invention.

FIGS. 21 to 24 are views for illustrating a method or process of manufacturing a semiconductor device by securing or fixing together the semiconductor element and the element suspending member.

Referring to the figures, a lead frame 2f and a semiconductor element 1 are first disposed on a jig 8a and then pressed against the latter stationarily by means of another jig 8b. In this state, a bonding resin 3 is ejected through nozzles 8n. After setting of the resin, the jigs 8a and 8b are removed, whereon a sealing resin layer 5 is formed for sealing off the semiconductor device.

In carrying out the abovementioned manufacturing method, it is necessary to hold the semiconductor element 1 and the element suspending member 2s under pressure by applying an external force F so that the bonding resin is prevented from flowing beneath them. Further, it is preferred to heat simultaneously the assembly to thereby increase the fluidity of the bonding resin 3.

Figure 25:
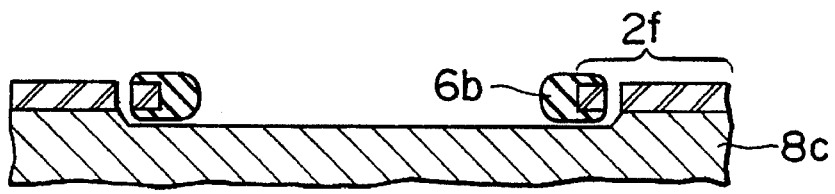
FIGS. 25, 26 and 27 are sectional views showing sequentially steps of manufacturing a semiconductor device according to another embodiment of the invention.
Figure 26:
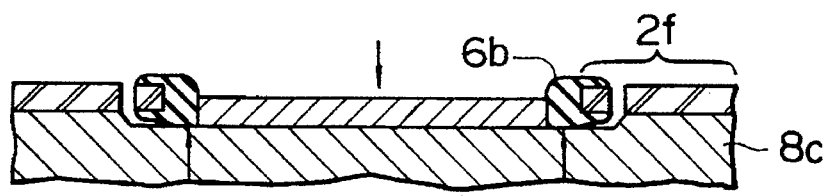
Figure 27:
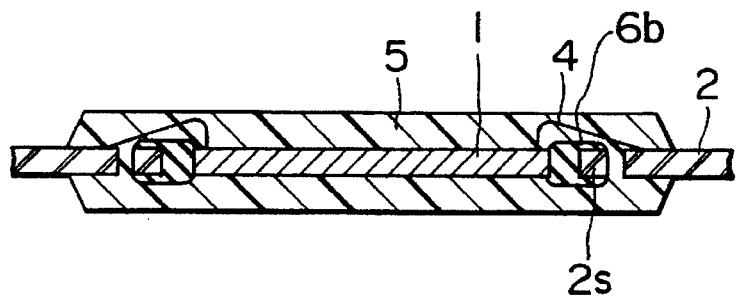

FIGS. 25 to 27 are views for illustrating a method of securing together the semiconductor element and the element suspending member by using an electrically insulating cushion.

Referring to the figure, a lead frame 2f is disposed on a jig 8c, whereon a semiconductor element 1 is placed within the lead frame 2f while contacting with a cushion 6b provided in the manner described hereinbefore. Thereafter, the assembly thus formed is removed from the jig 8c and a sealing resin layer 5 is deposited to seal off the semiconductor device.

Figure 28:
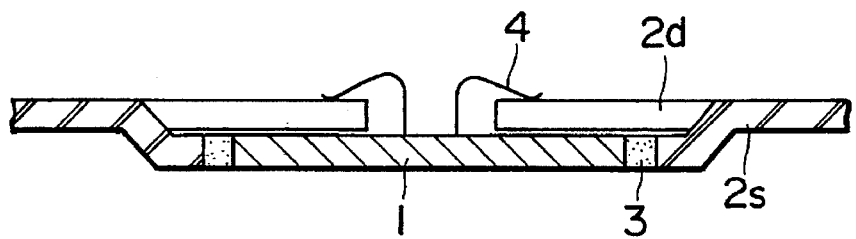
FIG. 28 is a sectional view of the semiconductor device according to a twelfth embodiment of the invention.

FIG. 28 is a sectional view of a semiconductor device according to a twelfth embodiment of the invention taken in the thicknesswise direction. In the figure, the sealing resin is omitted from illustration. The embodiment of the invention now under consideration is applied to a semiconductor device of a lead-on-chip (LOC) structure, wherein the leads serving for electrical connection are denoted by 2d while the semiconductor element suspending member is denoted by 2s. According to the teaching of the invention incarnated in the instant embodiment, the bonding strength between the semiconductor element 1 and the lead frame 1 of the semiconductor device of LOC structure can further be increased. Parenthetically, it should be mentioned that dummy leads serving for no electrical connection may be used as the element suspending means.

Figure 29:
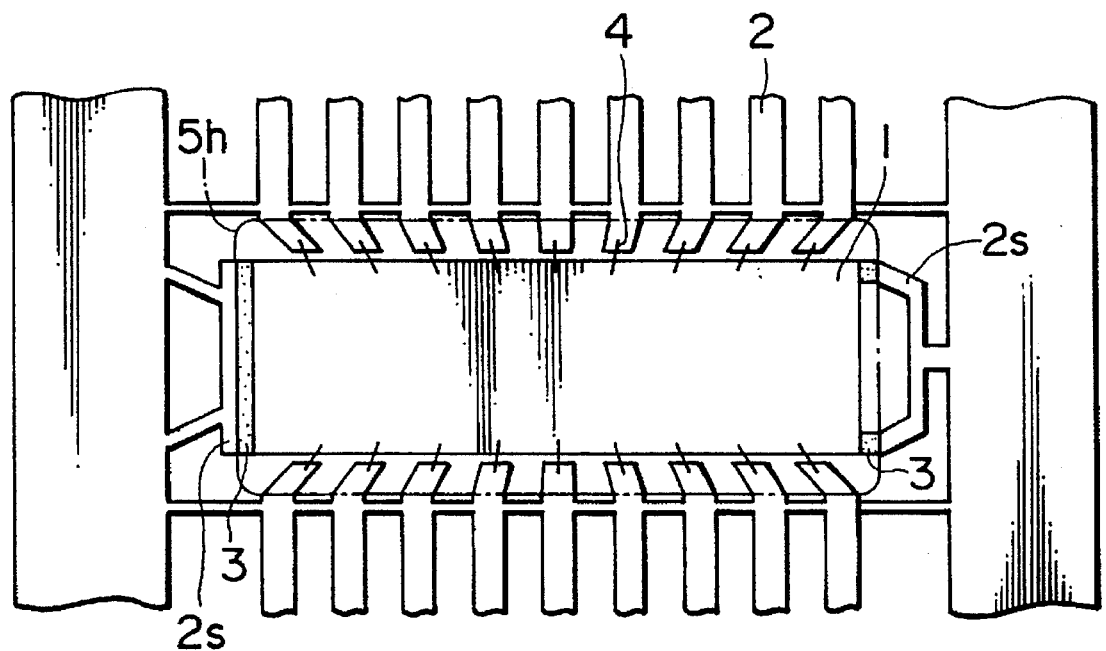
FIG. 29 is a top plane view showing a lead frame having a semiconductor device assembled therein according to a thirteenth embodiment of the invention.
Figure 30:
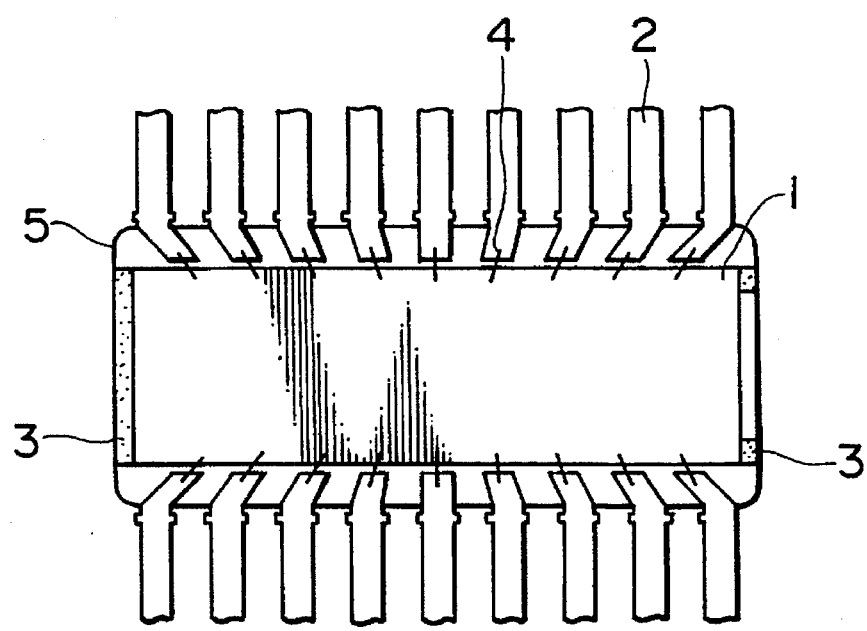
FIG. 30 is a top plane view showing a semiconductor device incorporating the lead frame of FIG. 29 with a resin deposited over a semiconductor element being removed.

FIGS. 29 and 30 show a thirteenth embodiment of the invention. In FIG. 29, there are shown in combination two modes of carrying out the invention, wherein in a right half portion, an element suspending member 2s is of a Y-like form and bonded pointwise to side surfaces of a semiconductor element, while in a left half, the element suspending members 2s are implemented in a bar-like shape and extend in parallel with the side or lateral surfaces of the semiconductor element 1, wherein a bonding resin 3 is injected in a gap between the semiconductor element and the element suspending member 1. FIG. 30 is a view showing the semiconductor device in the state where the element suspending member 2s is cut away at the position of the bonding resin 3. As a result, an exposed surface of the bonding resin 3 appears in the external surface of the package, which provides however no problem in respect to the tight contact and the function or performance of the product.

Figure 31:
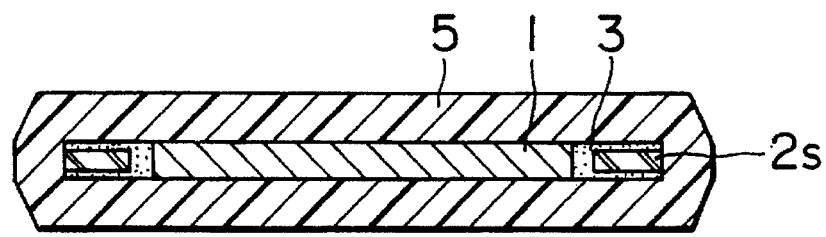
FIG. 31 is a sectional view of a semiconductor device according to a fourteenth embodiment of the invention.

FIG. 31 is a sectional view of a semiconductor device according to a fourteenth embodiment of the invention. As will be seen in the Figure, a bonding resin 3 covers not only a side (lateral) surface of the element suspending member 2s but also both top and bottom surfaces thereof. By virtue of such arrangement, the semiconductor device as produced is protected against occurrence of cracks due to close adhesion of a metal material of the suspending member and the bonding resin as well as close adhesion between the bonding resin and the sealing resin.

Figure 32:
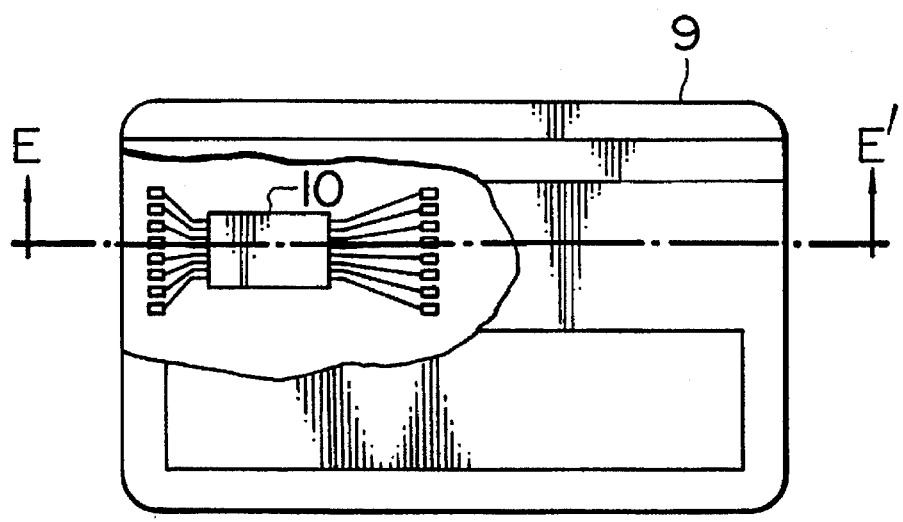
FIG. 32 is a top plane view showing a memory card according to a fifteenth embodiment of the invention.
Figure 33:
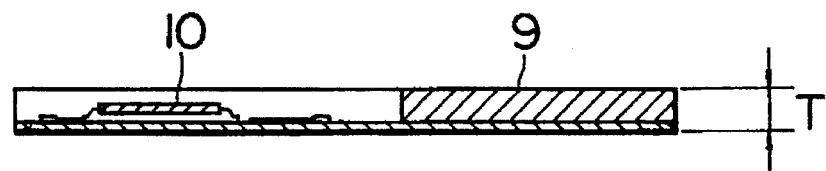
FIG. 33 is a sectional view taken along a line E–E' in FIG. 32.

FIG. 32 is a partially broken top plane view showing a semiconductor device 10 incorporated in a memory card according to a fifteenth embodiment of the invention with a portion being broken away, and FIG. 33 is a sectional view of the same taken along a line E–E' in FIG. 32. According to the teaching of the present invention incarnated in this embodiment, a thin semiconductor device having a thickness in a range of 0.65 to 0.7 mm can be manufactured. Accordingly, when the semiconductor device according to the invention is incorporated in a memory card having a same thickness T as that incorporating the prior art semiconductor device, there can be realized a memory card which is excellent over the prior art card in respect to the mechanical strength. Stated another way, for a same mechanical strength, a memory card of a smaller thickness T than the prior art card can be implemented according to the invention.

By way of numerical example, when a single semiconductor 1 is incorporated, there can be realized a memory card with a total thickness not exceeding 2.0 mm inclusive of thicknesses of the substrate and the resin layer, preferably with a total thickness not exceeding 1.8 mm and more preferably not exceeding 1.5 mm. In case a pair of semiconductor elements 1 are to be mounted on a single substrate, it is preferred to superpose the semiconductor devices with the substrate being sandwiched therebetween symmetrically to each other in order to reduce the area of the memory card. In this case, the thickness of the memory card can preferably be made smaller than 2.5 mm. In the prior art memory card, the semiconductor element is directly mounted on the substrate, whereon a resin coat is applied. In contrast, according to the teaching of the invention, the resin-sealed semiconductor device is mounted on the substrate of the memory card, which facilitates extremely the manufacture thereof.

Figure 34:
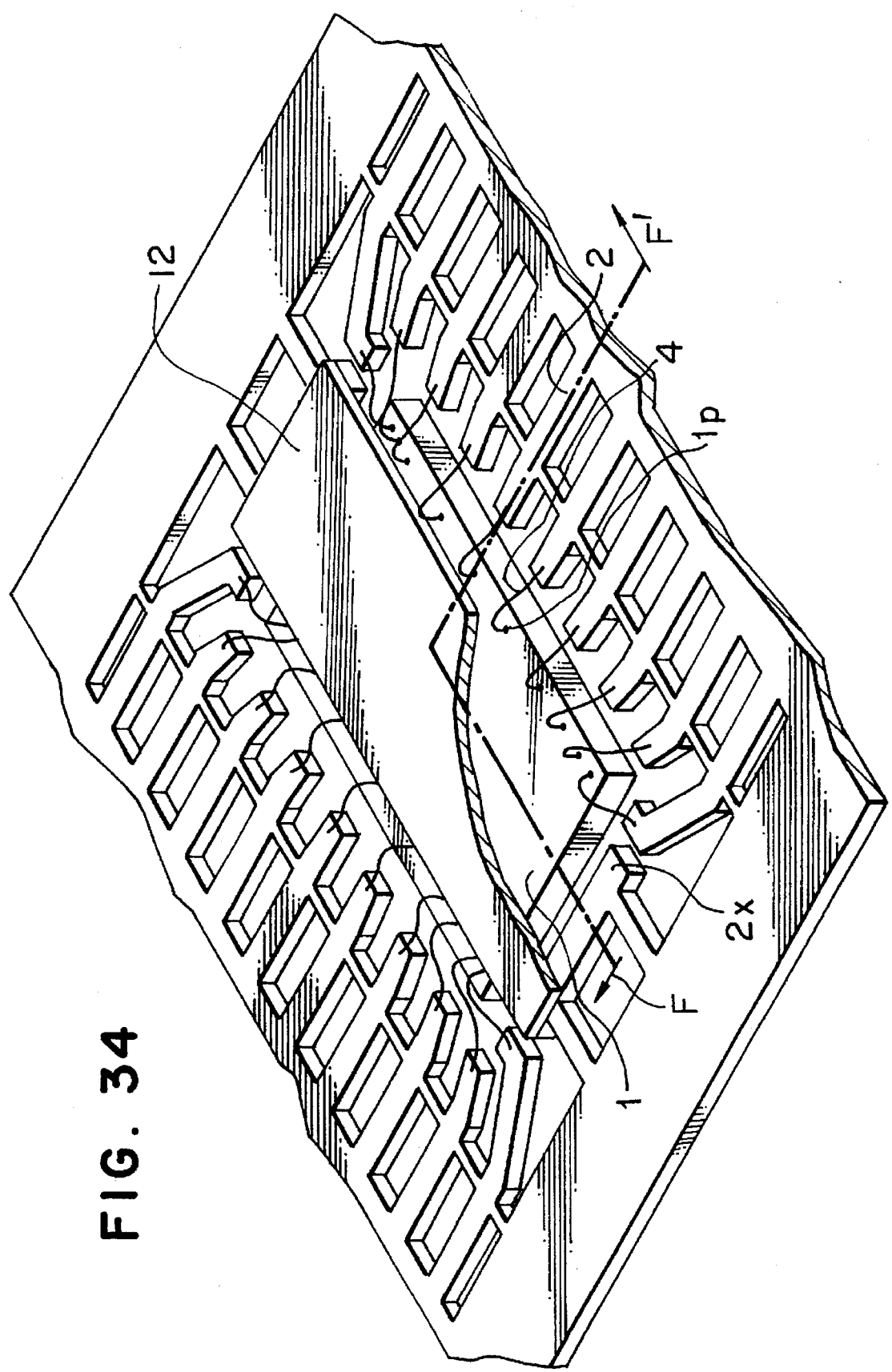
FIG. 34 is a partially broken perspective view showing an internal structure of a semiconductor device according to a sixteenth embodiment of the invention.

FIG. 34 is a perspective view showing an internal structure of a semiconductor device according to a sixteenth embodiment of the invention. As is seen in the figure, the semiconductor device is so disposed that its surface having circuits formed therein faces upwardly and is fixedly secured to element-suspending leads 2x through the medium of an insulation film 12 which is so configured that none of electrode pads 1p are covered by the film 12 when deposited over the semiconductor element 1. The electrode pads 1p are electrically connected to leads 2 by metal wires 4, respectively, so that the semiconductor device can be electrically communicated with external devices by way of the leads 4. The semiconductor device is completed by depositing a sealing resin layer over the portion shown in FIG. 34 through a transfer molding process and removing unnecessary portions by cutting.

Figure 35:
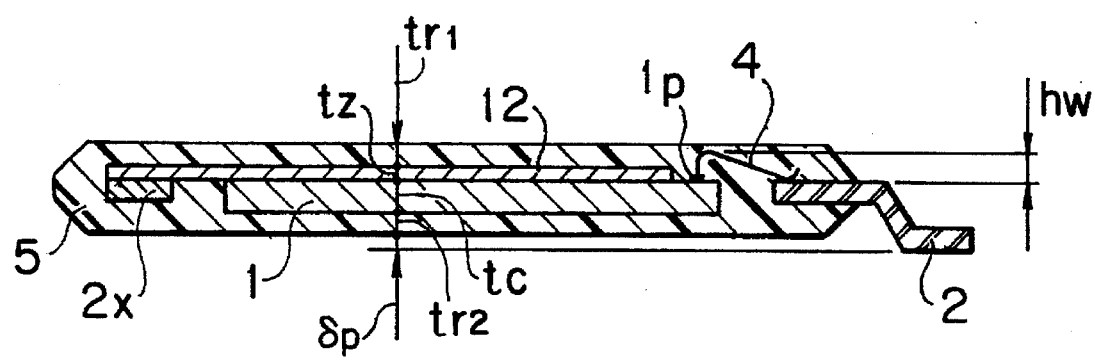
FIG. 35 is a sectional view of the same taken along a line F–F' in FIG. 34.

FIG. 35 is a sectional view of the abovementioned semiconductor device taken along a line F–F' in FIG. 34. A reference numeral 5 denotes a sealing resin. A wire loop height hw attainable with the present state of technique is usually more than 180 pm and at minimum on the order of 130 pm. In contrast, the thickness tz of the insulation film used in the device according to the invention may be 80 pm at the greatest and usually 40 pm to 50 pm while ensuring a sufficient mechanical strength, as a result of which the thickness tz can wholly be absorbed or covered by the height hw and plays no part in determining the thickness of the semiconductor device, which in turn means that the device can effectively be implemented in a thin structure.

By referring to FIG. 35, the overall thickness $t$ of the semiconductor device which can be realized by resorting to the present state of technique is roughly estimated as follows:

$$t = Tr1 + tz + tc + tr2 + \delta p$$
$$= 150 + 50 + 250 + 150 + 200$$
$$= 800 \, (\mu m)$$

It is thus apparent that the thickness $t$ can be reduced according to the invention by about 35 to 40% when compared with the prior art TSOP.

Figure 36:
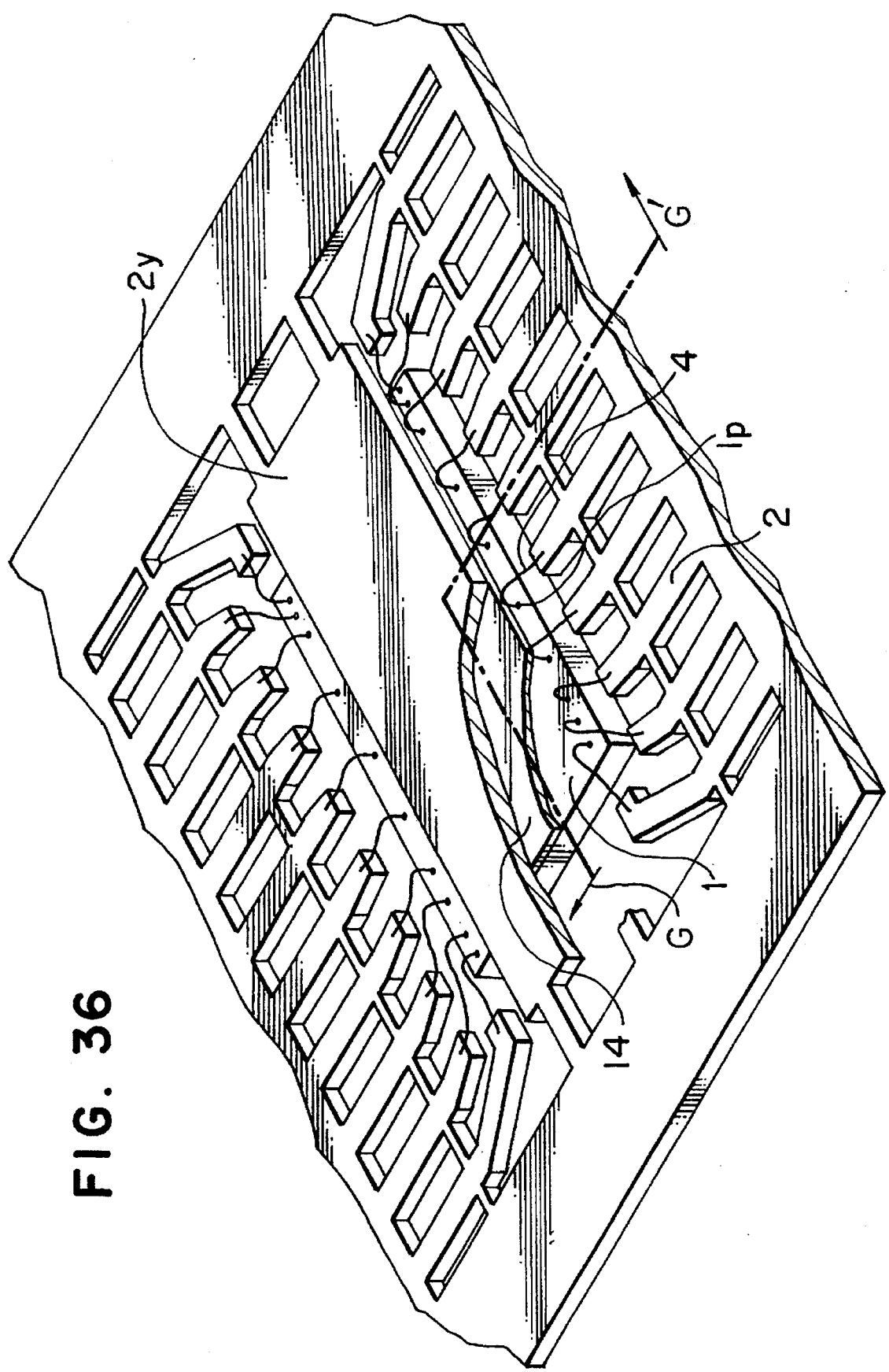
FIG. 36 is a partially broken perspective view showing an internal structure of a semiconductor device according to a seventeenth embodiment of the invention.

FIG. 36 is a perspective view showing an internal structure of a semiconductor device according to a seventeenth embodiment of the invention. A semiconductor element 1 is disposed, facing upwardly as viewed in the figure, and bonded by a bonding agent 14 to a tab 2y formed in a lead frame integrally with leads. The tab 2y is configured such that it does not overlie electrode pads 1p when the tab 2y is disposed on the semiconductor element 1. The electrode pads 1p are electrically connected to the associated leads 2 through metal wires 4 so that external connections of the semiconductor device can be made through the medium of these leads. The semiconductor device is completed by sealing the structure shown in FIG. 36 by a resin through a transfer molding process and removing unnecessary portions by cutting.

Figure 37:
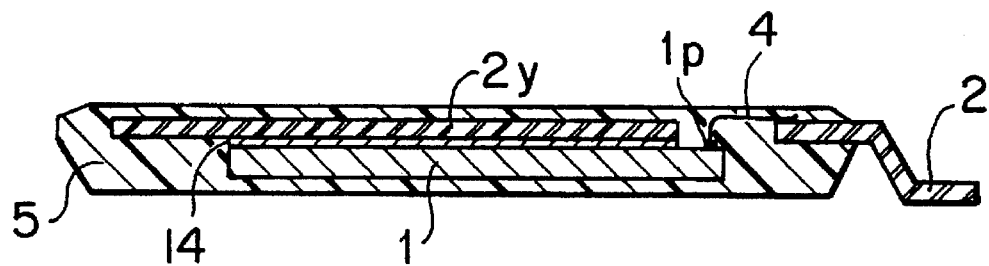
FIG. 37 is a sectional view of the same taken along a line G–G' in FIG. 36.

FIG. 37 is a sectional view of the semiconductor device taken along a line G–G' in FIG. 36. As will be seen in FIG. 37, the semiconductor device can be realized in a thin structure notwithstanding the use of a tab as described above by mounting the semiconductor element in such disposition that the surface having circuits formed therein is oriented in opposition to the tab.

Figure 38:
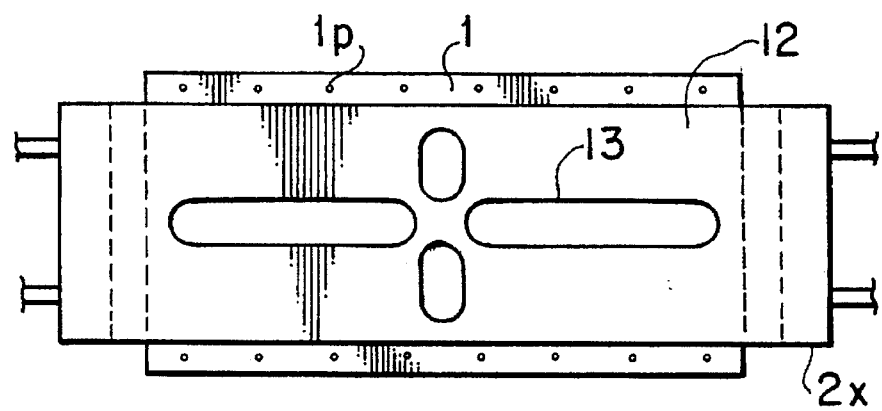
FIG. 38 is a top plane view showing an internal structure of a semiconductor device according to a eighteenth embodiment of the invention.

FIG. 38 is a top plan view showing an internal structure of a semiconductor device according to an eighteenth embodiment of the invention. In the case of the instant embodiment, slits 13 are formed through an insulation film 12 in the direction thicknesswise. With this structure, it is intended to increase the bonding strength of a semiconductor element 1 and the sealing resin by bonding them together through the slits 13 by taking advantage of the fact that a higher bonding strength can thereby be attained than that between the semiconductor element 1 and the insulation film 12, to thereby take the measures for protecting the semiconductor device against failure such as delamination of the sealing layer even when the semiconductor device is used in an environment of a high temperature. The shapes and the number of the slits or through-holes may be selected so far as the aimed effect mentioned above can be attained. Accordingly, there are conceivable numerous variations of the slits 13 without departing from the spirit of the invention.

Figure 39:
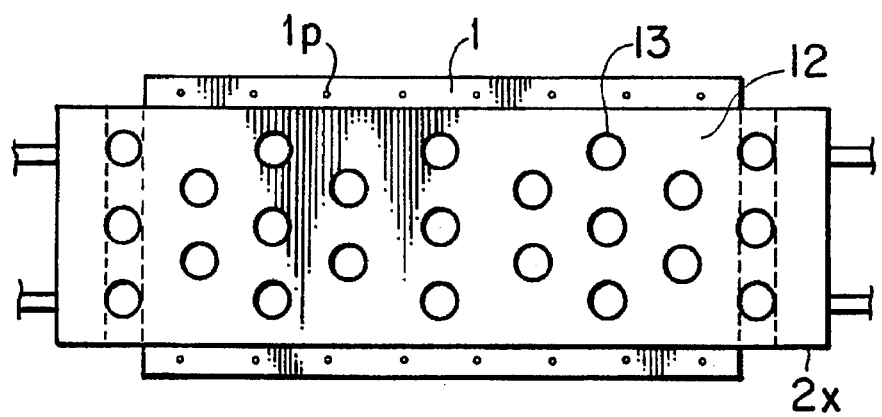
FIG. 39 is a top plane view showing an internal structure of a semiconductor device according to a nineteenth embodiment of the invention.
Figure 40:
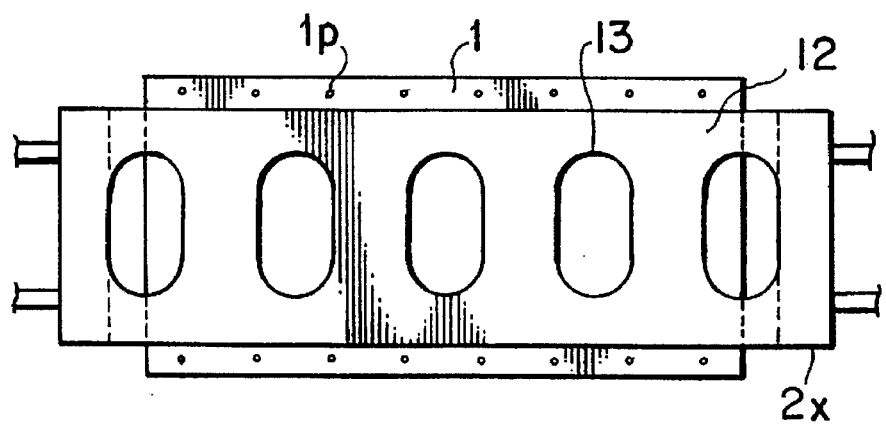
FIG. 40 is a top plane view showing an internal structure of a semiconductor device according to a twentieth embodiment of the invention.
Figure 41:
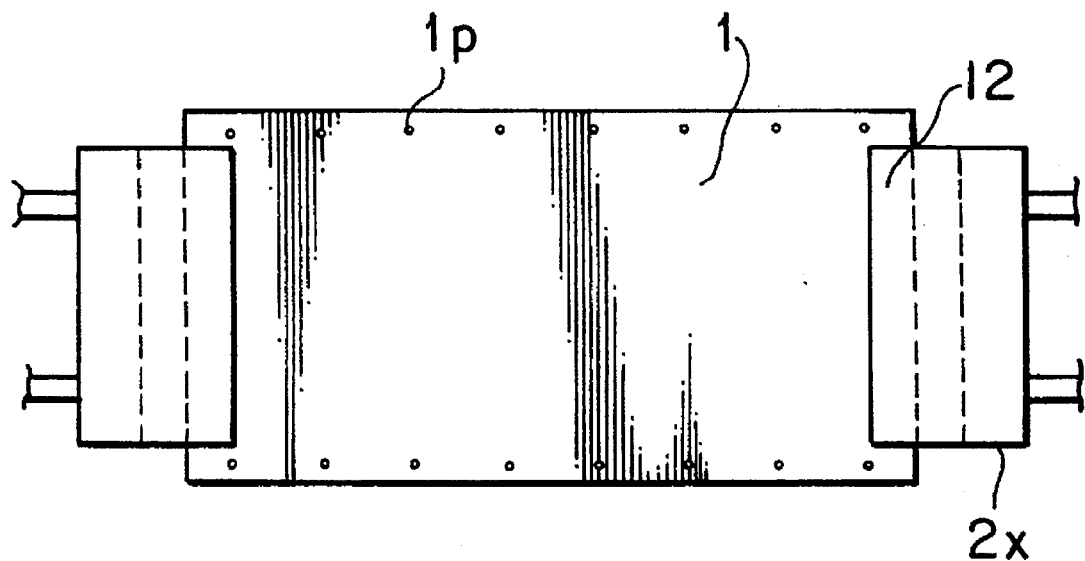
FIG. 41 is a top plane view showing an internal structure of a semiconductor device according to a twenty-first embodiment of the invention.
Figure 42:
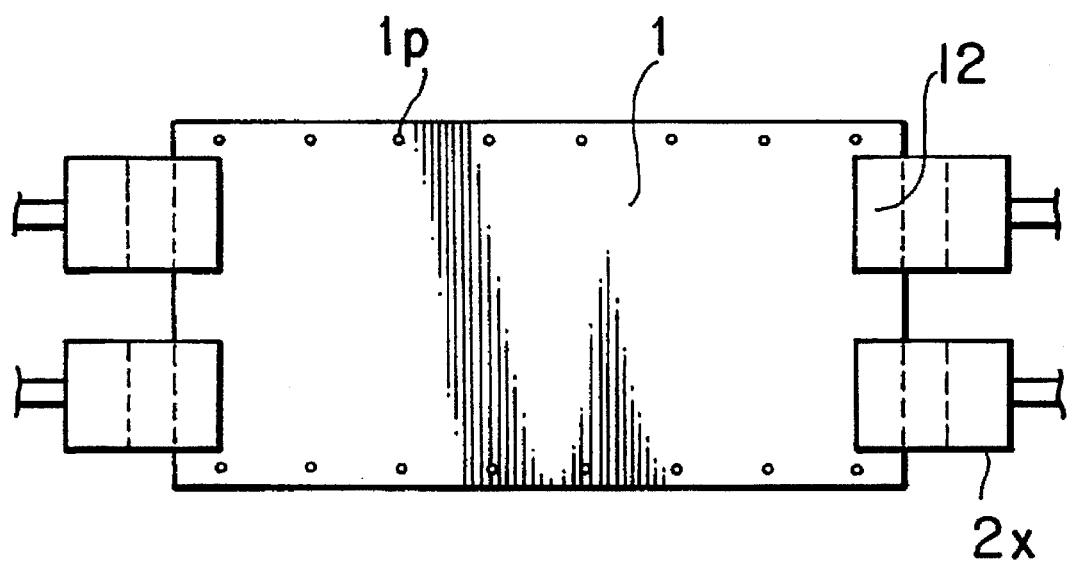
FIG. 42 is a top plane view showing an internal structure of a semiconductor device according to a twenty-second embodiment of the invention.

Several typical versions of the slits or through-holes or apertures are illustrated in FIGS. 39 to 42 as nineteenth to twenty-second exemplary embodiments of the invention, of which those shown in FIGS. 39 to 40 are arranged such that the slits 13 are formed or extend in a region where both surfaces of the insulation film are brought into contact with the sealing resin, i.e. the region in which neither the semiconductor element nor the element supporting leads 2x exist in the direction thicknesswise of the semiconductor device. With this structure, the slits are filled with the sealing resin, whereby the strength against thermal stress produced in the course of temperature cycle can be enhanced to an advantageous effect. In the case of the embodiments shown in FIGS. 41 and 42, the insulation film 12 is divided into parts with a minimum area required for the bonding being left. By reducing the volume of the insulation film 12 as in the case of these embodiments, the absolute amount of water which may be contained in the film 12 can be decreased, whereby the sealing resin can be protected against occurrence of cracks due to expansion of water content in a high temperature environment to another advantageous effect.

In the embodiments shown in FIGS. 38 to 42, the invention is concerned with the shape or configuration of the insulation film. It should however be understood that the same concept of the invention can equally be applied to the configuration of the tab described hereinbefore in conjunction with the seventeenth embodiment of the invention to similar profitable effects.

Figure 43:
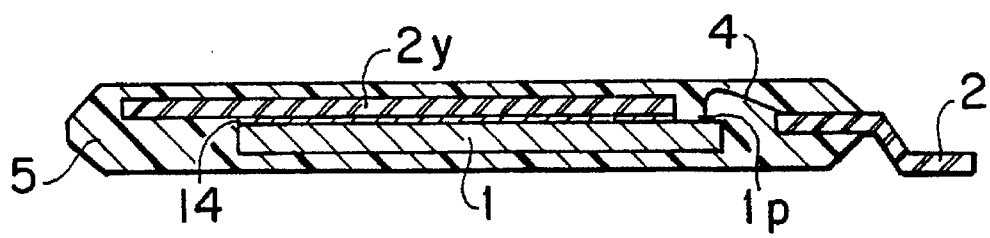
FIG. 43 is a sectional view similar to FIG. 37 showing a semiconductor device according to a twenty-third embodiment of the invention.

FIG. 43 is a sectional view similar to FIG. 37 and shows a semiconductor device according to a twenty-second embodiment of the invention. In this embodiment the semiconductor device has a tab like that shown in FIG. 17. In general, the tab 2y is formed integrally with the lead frame in the same plane as the leads 2 used for electric connection. In this conjunction, it is however noted that if the teaching of the invention is applied to this structure as it is, the wire connecting portions of the leads become too high when compared with the electrode pads, involving possibly an obstacle to the electrical connection and the sealing by resin. In order to evade such difficulty, in the semiconductor device according to the instant embodiment, there are previously provided offsets between the tab 2y and the leads 2.

Figure 44:
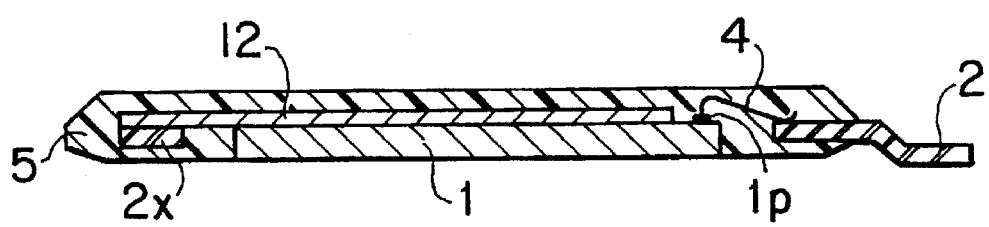
FIG. 44 is a sectional view similar to FIG. 35 showing a semiconductor device according to a twenty-fourth embodiment of the invention.

FIG. 44 is a sectional view similar to FIG. 35 and shows a semiconductor device according to a twenty fourth embodiment. Referring to the figure, a rear surface of a semiconductor element 1 is exposed exteriorly. By adopting this type sealing, the semiconductor device can be implemented in an extremely thin structure. The semiconductor device of the instant embodiment can ensure a sufficiently high reliability unless the environment in which the device is used is severe with respect to temperature and humidity. The semiconductor device of the instant embodiment is suited for use in applications where an extremely small thickness of the device is required, and the extent of the exposure of the rear surface of the semiconductor element 1 may be determined in dependence on the applications for which the semiconductor device is intended to be used. Accordingly, deposition of sealing resin on the rear surface of the semiconductor element due to diversions in accuracy of the resin sealing process gives rise to substantially no severe problem.

Figure 45:
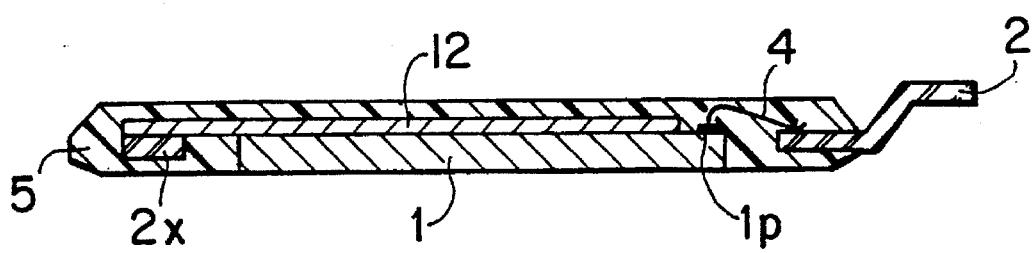
FIG. 45 is a sectional view similar to FIG. 35 showing a semiconductor device according to a twenty-fifth embodiment of the invention.

FIG. 45 is a sectional view similar to FIG. 35 and shows a semiconductor device according to a twenty-fifth embodiment of the invention. The structure of the instant device is similar to that of the twenty-fourth embodiment except that the direction in which the externally exposed portions of the leads 2 are bent. In both cases of the embodiments shown in FIG. 45 and FIG. 35, the distance from the root of the lead 2 to the contact surface of the substrate should preferably be made as long as possible in view of the fact that difference in thermal distortion and bending between the semiconductor device and the substrate can thereby be absorbed. In any case, in all the embodiments of the invention, the direction in which the leads Z are bent should desirably be taken into consideration as occasion requires.

Figure 46:
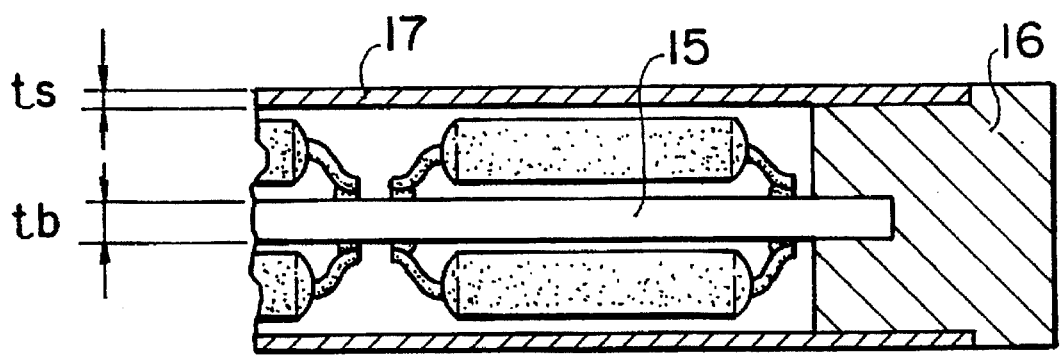
FIG. 46 is a sectional view showing a memory card according to a twenty-sixth embodiment of the invention.

FIG. 46 is a sectional view showing a memory card according to a twenty-sixth embodiment of the invention. Packaged on both surfaces of the substrate 15 are semiconductor devices according to the invention, respectively. The assembly thus obtained is secured to a frame 16, which is then enclosed by stainless steel plates 17 at both surfaces. The substrate 15 and the stainless steel sheet 17 are of thicknesses tb and ts on the order of 0.5 mm and 0.2 mm, respectively. Because the semiconductor device can be realized in an overall thickness not exceeding 0.8 mm according to the invention, as described hereinbefore, there can be obtained a memory card having a thickness of 3.3 mm.

We claim:

1. A lead frame, comprising:

a group of leads serving for intermediate parts for external electric connection of a semiconductor element; and dummy lead parts having lateral surfaces facing in opposition to lateral surfaces of said semiconductor element.

2. A lead frame, comprising:

a group of leads serving for intermediate parts for external electric connection of a semiconductor element; and an element suspending member for temporarily fixing said semiconductor element, said element suspended member having lateral surfaces facing in opposition to lateral surfaces of said semiconductor element with said element suspending member and said semiconductor element facing each other only with said lateral surfaces.

3. A memory card incorporating a resin-sealed semiconductor device, wherein said resin-sealed semiconductor comprises:

a semiconductor element;

a group of leads serving for external electric connecting of said semiconductor element;

a connecting member for electrically interconnecting the individual leads of said lead group and said semiconductor element;

a sealing layer for sealing said connecting member, said semiconductor element and portions of said individual leads of said lead group; and dummy leads provided separately from the leads of said lead group and lying on a same plane as said lead group;

wherein said dummy leads are so disposed that lateral surfaces thereof face in opposition to lateral surfaces of said semiconductor element.

4. A memory card according to claim 3, said memory card incorporating only one semiconductor device, wherein an overall thickness of said memory card is not greater than 2.0 mm.

5. A memory card according to claim 3, said memory card incorporating two semiconductor devices, wherein an overall thickness of said memory card is not greater than 2.5 mm.

6. A memory card according to claim 3, wherein said semiconductor device are disposed on a substrate and electrically connected to circuits formed in said substrate, whereon a resulting assembly is covered peripherally by a packaging member.

7. A memory card incorporating a resin-sealed type semiconductor device, wherein said semiconductor device comprises:

a semiconductor element;

a group of leads serving for external electric connection of said semiconductor element;

a connecting member for electrically interconnecting the individual leads of said lead group and said semiconductor element;

a sealing layer for sealing said connecting member, said semiconductor element and portions of said individual leads of said lead group;

wherein said semiconductor element has a lateral surface bonded to a lateral surface of said element suspending member by means of a bonding member.

8. A memory card according to claim 7, said memory card incorporating only one semiconductor device, wherein an overall thickness of said memory card is not greater than 2.0 mm.

9. A memory card according to claim 7, said memory card incorporating two semiconductor devices, wherein an overall thickness of said memory card is not greater than 2.5 mm.

10. A memory card according to claim 7, wherein said semiconductor device are disposed on a substrate and electrically connected to circuits formed in said substrate, wherein a resulting assembly is covered peripherally by a packaging member.

11. A memory card incorporating a resin-sealed type semiconductor device, wherein said semiconductor device comprises:

a semiconductor element;

a group of leads serving for external electric connection of said semiconductor element;

a connecting member for electrically interconnecting the individual leads of said lead group and said semiconductor element;

a sealing layer for sealing said connecting member, said semiconductor element and portions of said individual leads of said lead group;

said leads being constituted by a predetermined electrically insulating member which has a surface formed with an electrically conductive layers which serves for said external electric connecting of said semiconductor element;

wherein said semiconductor element is bonded at lateral surfaces thereof to those portions of said electrically insulating member which are exposed at lateral surfaces thereof by a bonding agent.

12. A memory card according to claim 11, said memory card incorporation only one semiconductor device, wherein an overall thickness of said memory card is not greater than 2.0 mm.

13. A memory card according to claim 11, said memory card incorporating two semiconductor devices, wherein an overall thickness of said memory card is not greater than 2.5 mm.

14. A memory card according to claim 11, wherein said semiconductor device are disposed on a substrate and electrically connected to circuits formed in said substrate, wherein a resulting assembly is covered peripherally by a packaging member.

15. A memory card incorporating a resin-sealed type semiconductor device, wherein said semiconductor device comprises:

a semiconductor element;

a lead frame serving for external electric connecting of said semiconductor element;

a connecting member for electrically interconnecting said lead frame and said semiconductor element; and a sealing layer for sealing said connecting member, said semiconductor element and a portion of said lead frame;

said lead frame being constituted by a predetermined electrically insulating member which has a surface formed with an electric conductor pattern to serve for said external electric connection of said semiconductor element;

wherein said lead frame is formed with a through-hole for receiving therein said semiconductor element of which lateral surfaces are bonded to those portions of lateral surfaces of said electrically insulating member which are exposed to said throughhole.

16. A memory card according to claim 15, said memory incorporating only one semiconductor device, wherein an overall thickness of said memory card is not greater than 2.0 mm.

17. A memory card according to claim 15, said memory card incorporating two semiconductor devices, wherein an overall thickness of said memory card is not greater than 2.5 mm.

18. A memory card according to claim 15, wherein said semiconductor device are disposed on a substrate and electrically connected to circuits formed in said substrate, whereon a resulting assembly is covered peripherally by a packaging member.

19. A memory card incorporating a resin-sealed type semiconductor device, wherein said semiconductor device comprises:

a semiconductor element;

a group of leads serving for external electric connection of said semiconductor element;

a connecting member for electrically interconnecting the individual leads of said lead group and said semiconductor element;

a sealing layer for sealing said connecting member, said semiconductor element and portions of said individual leads of said lead group;

a sealing resin interposed between said semiconductor element and said lead group; and a bonding agent layer formed on lateral surface of said semiconductor element in addition to said sealing resin;

wherein on end portion of said bonding agent layer is exposed externally of said semiconductor elements.

20. A memory card according to claim 19, said memory card incorporating only one semiconductor device, wherein an overall thickness of said memory card is not greater than 2.0 mm.

21. A memory card according to claim 19, said memory card incorporating two semiconductor devices, wherein an overall thicknesses of said memory card is not greater than 2.5 mm.

22. A memory card according to claim 19, wherein said semiconductor device are disposed on a substrate and electrically connected to circuits formed in said substrate, whereon a resulting assembly is covered peripherally by a packaging member.

23. A memory card incorporating a semiconductor device disposed on a substrate and enclosed by a casing, wherein said semiconductor device comprises:

a semiconductor element;

a plurality of metal leads each having a thickness differing from that of said semiconductor element;

a plurality of metal wires for electrically interconnecting said semiconductor element and said leads;

at least one electrically insulating film; and a sealing resin layer for sealing said film, said wires, said semiconductor element and portions of said leads;

wherein said electrically insulating film is positioned on a surface of said semiconductor element on which a circuit is formed; and wherein said semiconductor element and said connecting wires for connecting said semiconductor element to said leads are disposed in a same plane.

24. A memory card incorporating a semiconductor device mounted on a substrate and enclosed by a casing, wherein said semiconductor device comprises:

a semiconductor element, a plurality of metal leads, a plurality of metal wires, at least one electrically insulating film, and a sealing resin, wherein said semiconductor element and predetermined portions of said leads are attached to a same surface of said electrically insulating film to be temporarily fixed thereto while said semiconductor element is so disposed that the surface thereof having a circuit formed thereon faces in opposition to said electrically insulating film and that projections of electrode pads of said semiconductor element as viewed in the direction planewise of said semiconductor elements do not assume positions which are superposed on said electrically insulating film, and wherein said sealing resin is interposed between two lateral surfaces of said semiconductor element and those leads to which said wires are connected and which are spaced from the lateral surface of said semiconductor element by a shortest distance.

25. A memory card according to claim 24, wherein the leads connected to the electrode pads by said wires are so disposed that projections of said leads as viewed in the direction planewise do not assume positions superposed on said semiconductor element.

26. A memory card incorporating a semiconductor device mounted on a substrate and enclosed by as casing, wherein said semiconductor device comprises:

a semiconductor element, at least one sheet of tab, an electrically insulating adhesive, a plurality of metals leads a plurality of metal wires and a sealing resin, wherein said semiconductor element and said tab are temporarily secured together by mounting said semiconductor element on said tab with an interposition of a bonding agent therebetween, while attached to a same surface of said electrically insulating film to be temporarily fixed thereto while said semiconductor element is so disposed that the surface thereof having a circuit formed thereon faces in opposition to said tab and that projections electrode pads of said semiconductor element as viewed in the direction planewise of said semiconductor element do not assume positions which are superposed on said tab, and wherein sealing resin is interposed between two lateral surfaces of said semiconductor element and these leads to which said wires are connected and which are spaced from the lateral surface of said semiconductor element by shortest distance.

27. A memory card according to claim 26, wherein the leads connected to the electrode pads by said wires are so disposed that projections of said leads as viewed in the direction planewise do not assume positions superposed on said semiconductor element.

28. A memory card comprising a resin sealed semiconductor device mounted on a substrate having a circuit to which leads of said semiconductor device are connected, the whole assembly being covering by a resin material, an overall thickness of said memory card inclusive of said resin material being not greater than 2.0 mm.

29. A memory card comprising a pair of resin sealed semiconductor devices disposed, respectively, on both surfaces of a single substrate, wherein leads of said semiconductor devices are connected to a circuit implemented in said substrate, the whole assembly being completely covered with a resin material, a total sum of thickness of said memory card being not greater than 2.5 mm.

* * * * *